United States Patent
Nakamura et al.

(10) Patent No.: US 8,233,347 B2
(45) Date of Patent: Jul. 31, 2012

(54) SEMICONDUCTOR MEMORY, SEMICONDUCTOR DEVICE, AND SYSTEM

(75) Inventors: Toshikazu Nakamura, Tokyo (JP); Atsushi Takeuchi, Tokyo (JP); Atsushi Nakakubo, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 313 days.

(21) Appl. No.: 12/631,353

(22) Filed: Dec. 4, 2009

(65) Prior Publication Data

US 2010/0142306 A1 Jun. 10, 2010

(30) Foreign Application Priority Data

Dec. 8, 2008 (JP) .................................. 2008-312563

(51) Int. Cl.
*G11C 5/14* (2006.01)
*G11C 8/00* (2006.01)

(52) U.S. Cl. .................. 365/227; 365/189.09; 365/226; 365/230.06

(58) Field of Classification Search .................... 365/227
See application file for complete search history.

(56) References Cited

U.S. PATENT DOCUMENTS

| | | | |
|---|---|---|---|
| 5,877,651 A * | 3/1999 | Furutani | 327/538 |
| 6,201,437 B1 * | 3/2001 | Kono et al. | 327/545 |
| 6,285,622 B1 * | 9/2001 | Haraguchi et al. | 365/226 |
| 6,429,725 B1 * | 8/2002 | Tanzawa et al. | 327/536 |
| 6,473,321 B2 * | 10/2002 | Kishimoto et al. | 363/59 |
| 6,504,783 B2 * | 1/2003 | Jo | 365/226 |
| 6,724,242 B2 * | 4/2004 | Kim et al. | 327/536 |
| 6,762,960 B2 * | 7/2004 | Natori | 365/189.09 |
| 6,774,708 B2 | 8/2004 | Matsui | |
| 6,781,439 B2 * | 8/2004 | Tanzawa et al. | 327/536 |
| 7,184,358 B2 * | 2/2007 | Kobayashi et al. | 365/230.06 |
| 2005/0105322 A1 | 5/2005 | Kobayashi et al. | |
| 2005/0105372 A1 | 5/2005 | Kanda | |
| 2008/0123463 A1 | 5/2008 | Matsubara | |

FOREIGN PATENT DOCUMENTS

| | | |
|---|---|---|
| JP | 2003-109381 A | 4/2003 |
| JP | 2005-158223 A | 6/2005 |
| JP | 2008-135099 A | 6/2008 |

* cited by examiner

*Primary Examiner* — Son Mai
(74) *Attorney, Agent, or Firm* — Arent Fox LLP

(57) ABSTRACT

A semiconductor memory includes: a voltage supply circuit which supplies a first voltage to a word line when an internal circuit is in a standby state, and supplies a second voltage higher than the first voltage to the word line when the internal circuit is in an active state; and a control circuit changes a drive capacity of the voltage supply circuit when changing from the standby state to the active state and the second voltage is supplied to the word line.

18 Claims, 17 Drawing Sheets

US 8,233,347 B2

SEMICONDUCTOR MEMORY, SEMICONDUCTOR DEVICE, AND SYSTEM

CROSS-REFERENCE TO RELATED APPLICATIONS

This application claims the benefit of priority from Japanese Patent Application No. 2008-312563 filed on Dec. 8, 2008, the entire contents of which are incorporated herein by reference.

BACKGROUND

1. Field

The embodiments discussed herein relates to a semiconductor memory including a voltage supply circuit.

2. Description of Related Art

In a pMOS transistor in which a high voltage is applied to a gate, a gated induced drain leakage (GIDL) current may occur. The GIDL current flows from a substrate of the transistor to a drain or a source, depending on the gate voltage. The GIDL current may occur in a transistor in which a difference between the gate voltage and a drain voltage or source voltage is large. In an nMOS transistor too, when the difference between the gate voltage and the drain voltage or source voltage is large, the GIDL current may flow from the drain or source to the substrate.

Related art is disclosed in Japanese Laid-open Patent Publication No. 2003-109381, Japanese Laid-open Patent Publication No. 2005-158223, Japanese Laid-open Patent Publication No. 2008-135099, and the like.

SUMMARY

According to one aspect of embodiments, a semiconductor memory is provided which includes: a voltage supply circuit which supplies a first voltage to a word line when an internal circuit is in a standby state, and supplies a second voltage higher than the first voltage to the word line when the internal circuit is in an active state; and a control circuit changes a drive capacity of the voltage supply circuit when changing from the standby state to the active state and the second voltage is supplied to the word line.

Additional advantages and novel features of the invention will be set forth in part in the description that follows, and in part will become more apparent to those skilled in the art upon examination of the following or upon learning by practice of the invention.

DESCRIPTION OF EMBODIMENTS

A voltage supply circuit of a pumping circuit or the like generates a high voltage. For example, the pumping circuit changes a supply capability of a high voltage in accordance with an operational condition of a semiconductor device. When the pumping circuit generates a high voltage, an operational frequency of the voltage supply circuit increases due to an occurrence of a GIDL current, and a consumption current increases. In order to reduce the GIDL current, for example, a gate voltage is set at a value lower than the high voltage in a standby period where a transistor does not operate.

In the Figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
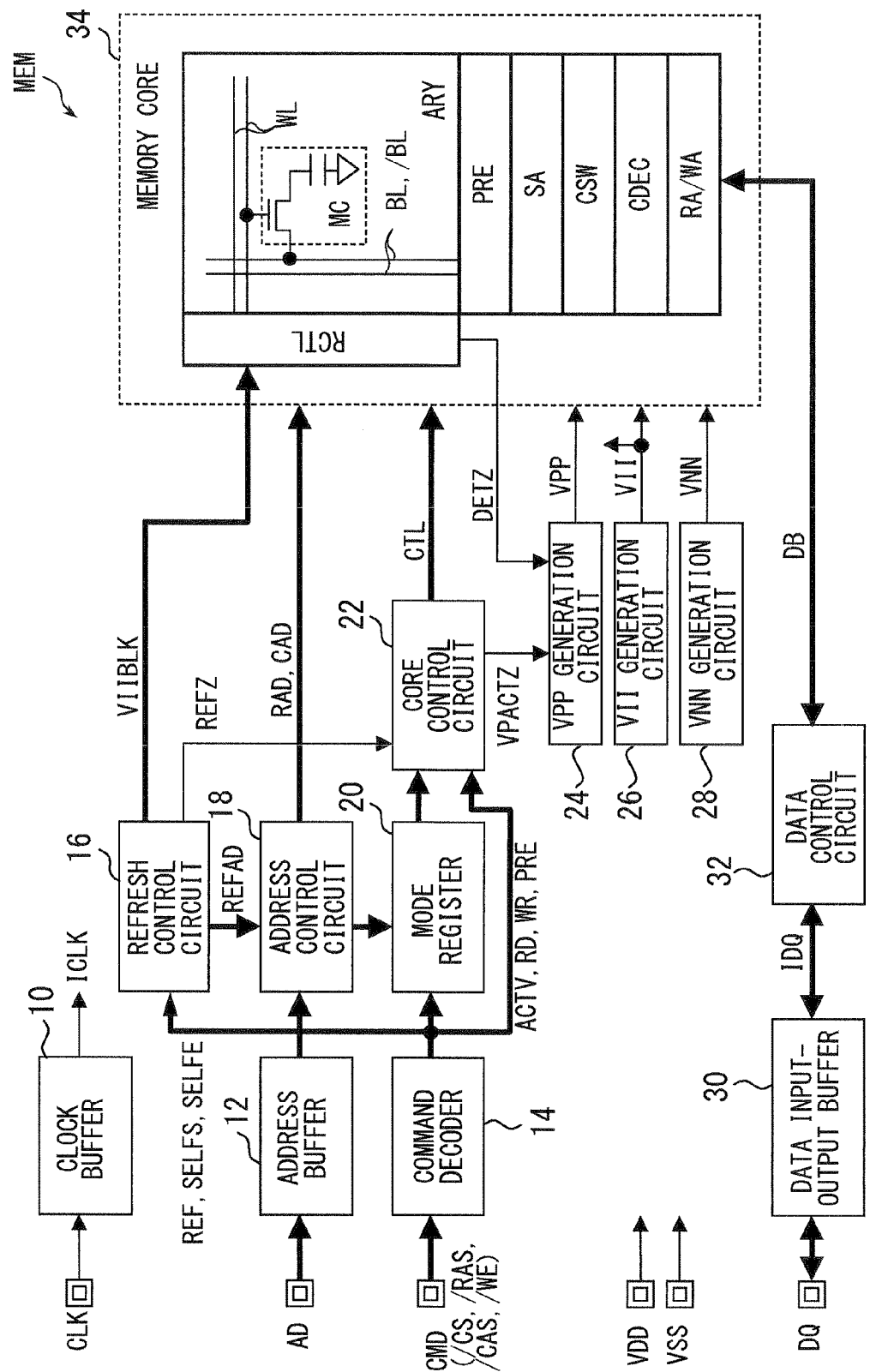
FIG. 1 illustrates a first embodiment.

FIG. 1 illustrates a first embodiment. For example, a semiconductor memory MEM may be an SDRAM. The semiconductor memory MEM may operate in synchronization with a clock signal CLK or may operate asynchronously with respect to the clock signal CLK. The semiconductor memory MEM may include a memory macro (IP) installed in a system LSI or the like, and may include a semiconductor storage device enclosed in a package.

The semiconductor memory MEM is, for example, formed on a silicon substrate using a CMOS process. The semiconductor memory MEM includes a clock buffer 10, an address buffer 12, a command decoder 14, a refresh control circuit 16, an address control circuit 18, a mode register 20, a core control circuit 22, a VPP generation circuit 24, a VII generation circuit 26, a VNN generation circuit 28, a data input-output buffer 30, a data control circuit 32, and a memory core 34.

The clock buffer 10 receives a clock signal CLK via a clock terminal, and outputs an internal clock signal ICLK. The internal clock signal ICLK is supplied to a circuit which operates in synchronization with a clock. The address buffer 12 receives an address signal AD via an address terminal, and outputs the received address signal to the address control circuit 18. At least one portion of the address terminal may receive sequentially a row address signal RAD and a column address signal CAD. The semiconductor memory MEM may be an address multiplex type which receives the row address signal RAD and the column address signal CAD in a common address terminal AD at differing timings.

The command decoder 14 receives a command signal CMD via a command terminal, decodes the received signal, and outputs an internal command signal for operating the memory core 34. The command signal CMD includes, for example, a chip select signal /CS, a row address strobe signal /RAS, a column address strobe signal /CAS, or a write enable signal /WE. The internal command signal includes an active signal ACTV, a read signal RD, a write signal WR, a precharge signal PRE, a refresh signal REF, a self refresh start signal SELFS, a self refresh end signal SELFE, or a mode register setting signal.

The refresh control circuit 16, in synchronization with a refresh signal REF, outputs a refresh signal REFZ and updates a refresh address signal REFAD. The refresh address signal REFAD may be, for example, a row address signal. The refresh control circuit 16, when receiving a self refresh start signal SELFS, switches an operational mode of the semiconductor memory MEM from a normal operational mode to a self refresh mode. The refresh control circuit 16, in the self refresh mode, outputs the refresh signal REFZ in a given cycle, and updates the refresh address signal REFAD and a switch block signal VIIBLK in synchronization with the refresh signal REFZ. The self refresh mode may be one type of standby mode. In the standby state, the semiconductor memory MEM periodically performs a refresh without receiving an external command.

When the refresh control circuit 16 receives a self refresh end signal SELFE, the operation mode of the semiconductor memory MEM is switched from the self refresh mode to the normal operation mode. In the normal operation mode, the refresh signal REFZ and refresh address signal REFAD are generated based on the refresh signal REF. In the normal operation mode, the value of the switch block signal VIIBLK may not be updated.

The address control circuit 18, in the normal operation mode, outputs the address signal AD from the address buffer 12 as a row address signal RAD or a column address signal CAD. The address control circuit 18, in the self refresh mode, outputs the refresh address signal REFAD from the refresh control circuit 16 as a row address signal RAD.

The mode register 20 is, for example, set based on an address signal AD supplied together with a mode register setting command. The address signal AD is supplied from the address control circuit 18. An operational specification of the semiconductor memory MEM, such as a burst length or a read latency, is changed by the mode register 20.

The core control circuit 22, based on the active signal ACTV, read signal RD, write signal WR, refresh signal REFZ, or mode register 20, outputs a control signal CTL which controls the memory core 34. The core control circuit 22, responding to the active signal ACTV or refresh signal REFZ, activates an active signal VPACTZ to a high level for a given period. For example, the given period may be a one cycle period of a read operation and a write operation.

The VPP generation circuit 24, using a power source voltage VDD supplied via a power supply terminal, generates a certain boosted voltage VPP which is higher than the power source voltage VDD, and supplies the generated voltage to the memory core 34. The boosted voltage VPP may be a high level voltage, or the like, of a main word line MWLX and a sub-word line WL. The VPP generation circuit 24 increases the supply capability of the boosted voltage VPP in the high level period of the active signal VPACTZ received together with a detection signal DETZ.

The VII generation circuit 26 reduces the power source voltage VDD, thereby generating a certain internal power source voltage VII. The internal power source voltage VII is supplied to an internal circuit. The internal power source voltage VII may be substantially the same as the power source voltage VDD.

The VNN generation circuit 28, using the power source voltage VDD and a ground voltage VSS, generates a certain negative voltage VNN, and supplies the generated voltage to the memory core 34. The negative voltage VNN may be a low level voltage, or the like, of the main word line MWLX and the sub-word line WL. The low level voltage may be set to the ground voltage VSS.

The power source voltage VDD, boosted voltage VPP, internal power source voltage VII, and negative voltage VNN may be, for example, 1.8 V, 2.7 V, 1.6 V, and −0.5 V. The semiconductor memory MEM may include a voltage generation circuit which generates a precharge voltage of bit lines BL and /BL.

The semiconductor memory MEM includes a voltage generation circuit which generates a high level voltage higher than the power source voltage VDD, and lower than the boosted voltage VPP. The high level voltage is used as a gate voltage for turning on an nMOS transistor which couples the bit line BL, or /BL, to a sense amplifier SA. The high level voltage is used as a gate voltage for turning on an nMOS transistor which couples the bit line BL, or /BL, to a precharge voltage line.

The data input-output buffer 30, in a read operation, outputs read data from the memory core 34 via data buses DB and IDQ to a data terminal DQ. The data input-output buffer 30, in a write operation, receives write data via the data terminal DQ, and outputs the received data to the memory core 34 via the data buses IDQ and DB.

The data control circuit 32 includes, for example, a parallel-serial conversion circuit which operates in a read operation, and a serial-parallel conversion circuit which operates in a write operation. The parallel-serial conversion circuit converts parallel read data output from the memory core 34 to the data bus DB to serial data, and outputs them sequentially to the data bus IDQ. The serial-parallel conversion circuit converts serial write data sequentially supplied to the data bus IDQ to parallel data, and outputs them to the data bus DB. A ratio of bit numbers of the data bus DB and data bus IDQ may be 4:1.

The memory core 34 includes a memory cell array ARY, a row control circuit RCTL, a precharge circuit PRE, the sense amplifier SA, a column switch CSW, a column decoder CDEC, a read amplifier RA, and a write amplifier WA.

The memory cell array ARY includes a plurality of dynamic memory cells MC disposed in a matrix form, a plurality of sub-word lines WL coupled to a row of the memory cells MC aligned in the horizontal direction of FIG. 1, and a plurality of bit line pairs BL and /BL coupled to a row of the memory cells MC aligned in the vertical direction of FIG. 1. The memory cells MC include a capacitor for holding data as a charge, and a transfer transistor which couples one end of the capacitor to the bit line BL or /BL. The other end of the capacitor is coupled to a reference voltage line. A reference voltage supplied to the reference voltage line may be, for example, the precharge voltage. The memory cell array ARY includes a plurality of row blocks RBLK, for example, RBLK 0 to 3. One of the row blocks RBLK 0 to 3 operates in the read operation, in the write operation, or in the refresh operation.

The row control circuit RCTL includes a row decoder, a main word line driver MWLDRV, a sub-word decoder SWDEC, and a high level control circuit HLVLCTL. The row decoder decodes the row address signal RAD, and generates a row decode signal. The main word line driver MWLDRV generates a main word line signal MWLX in accordance with the row decode signal. The sub-word decoder SWDEC drives the sub-word line WL in accordance with the main word line signal MWLX and the row decode signal. The high level control circuit HLVLCTL switches a high level voltage output to the main word line driver MWLDRV. The high level control circuit HLVLCTL, when switching the high level voltage of the main word line signal MWLX corresponding to one of the row blocks RBLK 0 to 3 from the boosted voltage VPP to the internal power source voltage VII, outputs the detection signal DETZ.

The row control circuit RCTL, in the self refresh mode, switches the high level voltage HLVL of the row block RBLK indicated by the switch block signal VIIBLK, for example, one of HLVL 0 to 3, from the boosted voltage VPP to the internal power source voltage VII. The switching of the voltage is performed in synchronization with a setting signal VIISET, for example, one of VIISET 0Z to 3Z. The row control circuit RCTL may not output the setting signal VIISET in the normal operation mode. For this reason, the high level voltage HLVL may not switch from the boosted voltage VPP to the internal power source voltage VII in the normal operation mode. A consumption of power accompanying the switching of the voltage may be reduced.

The precharge circuit PRE sets the bit line pair BL and /BL coupled to the sense amplifier SA, which is not operating, to the precharge voltage. The sense amplifier SA amplifies a voltage differential of the bit lines BL and /BL in an active period of the memory cell array ARY, or in a refresh operation period.

The column decoder CDEC decodes the column address signal CAD in order to select the bit line pair BL and /BL coupled to the memory cells MC accessed in the read operation and write operation. The column switch CSW couples the bit line pair BL and /BL to the read amplifier RA or write amplifier WA in accordance with a decode signal from the column decoder CDEC.

The read amplifier RA, in a read operation, amplifies complementary read data output via the column switch CSW. The write amplifier WA, in a write access operation, amplifies complementary write data supplied via the data bus DB, and supplies them to the bit line pair BL and /BL.

Figure 2:
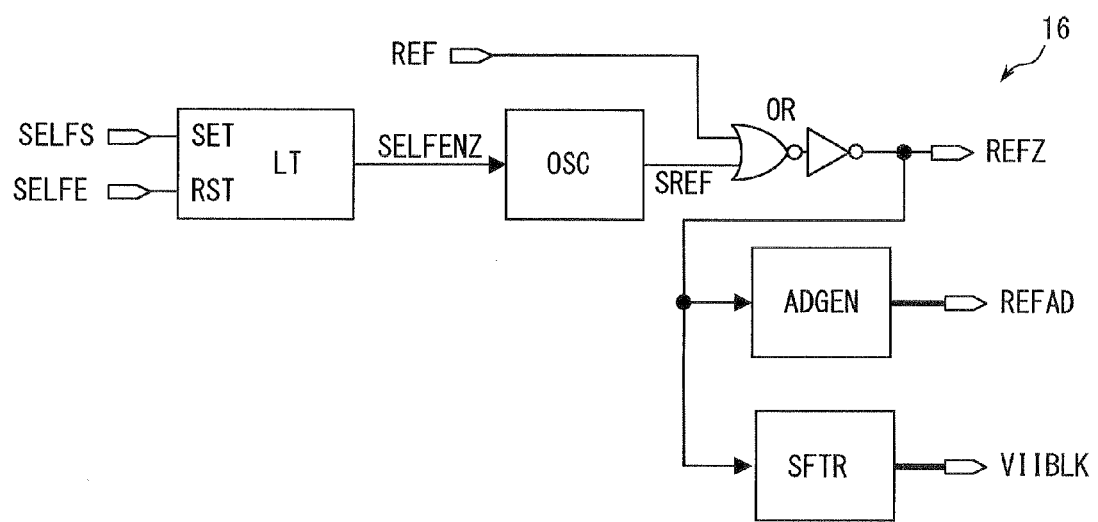
FIG. 2 illustrates an exemplary refresh control circuit.

FIG. 2 illustrates an exemplary refresh control circuit. The refresh control circuit illustrated in FIG. 2 may be the refresh control circuit 16 illustrated in FIG. 1. The refresh control circuit 16 includes a latch circuit LT, an oscillator OSC, an OR circuit, an address generation circuit ADGEN, and a shift register SFTR.

The latch circuit LT activates a self refresh enable signal SELFENZ in synchronization with the self refresh start signal SELFS supplied to a set terminal SET. The latch circuit LT deactivates the self refresh enable signal SELFENZ in synchronization with the self refresh end signal SELFE supplied to a reset terminal RST.

The oscillator OSC, while the self refresh enable signal SELFENZ is activated, outputs a self refresh signal SREF in a given cycle. The generation cycle of the refresh signal REFZ may be several microseconds, or several tens of microseconds. The OR circuit outputs the self refresh signal SREF or the refresh signal REF as the refresh signal REFZ.

The address generation circuit ADGEN includes an address counter which sequentially generates the refresh address signal REFAD in synchronization with the refresh signal REFZ. A refresh operation, such as an auto refresh operation, is performed in response to a refresh command from outside the semiconductor memory MEM based on the refresh address signal REFAD generated by the address generation circuit ADGEN.

The shift register SFTR may generate sequential signals "0", "1", "2", and "3" as the switch block signal VIIBLK in synchronization with the refresh signal REFZ. The switch block signal VIIBLK indicates the number of the row blocks RBLK 0 to 3 which reduces the high level voltage of the main word line MWLX from the boosted voltage VPP to the internal power source voltage VII.

Figure 3:
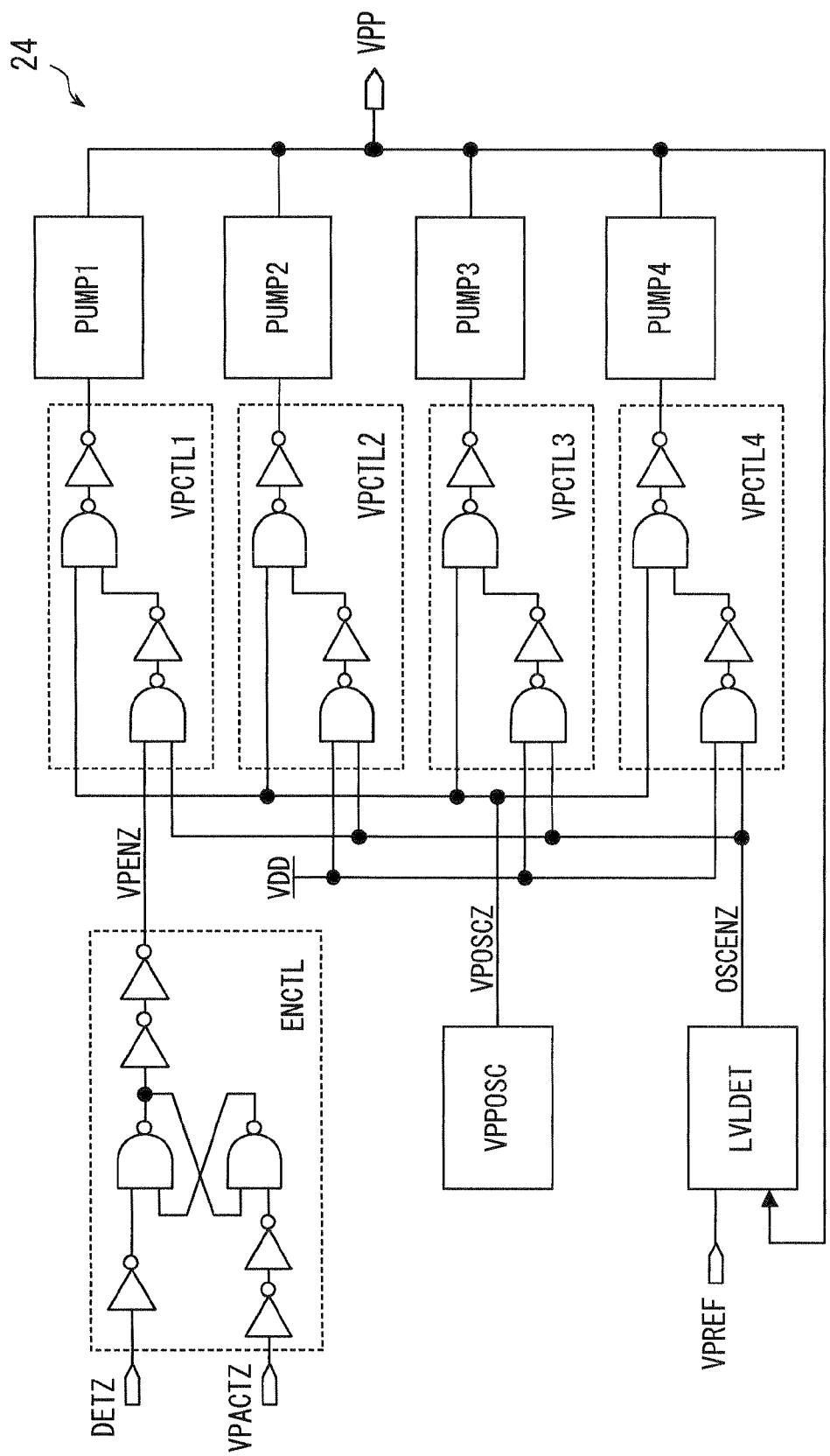
FIG. 3 illustrates an exemplary VPP generation circuit.

FIG. 3 illustrates an exemplary VPP generation circuit. The VPP generation circuit illustrated in FIG. 3 may be the VPP generation circuit 24 illustrated in FIG. 1. The VPP generation circuit 24 includes an enable control circuit ENCTL, an oscillator VPPOSC, a level detection circuit LVLDET, pump control circuits VPCTL 1 to 4, and pumping circuits pump 1 to 4.

The enable control circuit ENCTL activates an enable signal VPENZ to a high level in synchronization with a rising edge of the detection signal DETZ. The enable control circuit ENCTL deactivates the enable signal VPENZ to a low level in synchronization with a trailing edge of the active signal VPACTZ.

The oscillator VPPOSC outputs an oscillation signal VPOSCZ in a given cycle. The level detection circuit LVLDET activates an oscillation enable signal OSCENZ to a high level when the boosted voltage VPP becomes lower than the reference voltage VPREF. The level detection circuit LVLDET, when the boosted voltage VPP becomes equivalent to or higher than the reference voltage VPREF, deactivates the oscillation enable signal OSCENZ to a low level.

The pump control circuits VPCTL 1 to 4 may be substantially the same or similar each other. The pump control circuit VPCTL 1, in a period in which the enable signal VPENZ and oscillation enable signal OSCENZ are at a high level, outputs the oscillation signal VPOSCZ to the pumping circuit PUMP 1. The pump control circuits VPCTL 2 to 4, in a period in which the oscillation enable signal OSCENZ are at a high level, output the oscillation signal VPOSCZ to the pumping circuits PUMP 2 to 4 respectively.

The pumping circuits PUMP 1 to 4 may be substantially the same or similar each other. The pumping circuits PUMP 1 to 4 generate the boosted voltage VPP in synchronization with the oscillation signal VPOSCZ from the pump control circuits VPCTL 1 to 4. The boosted voltage VPP is generated by, for example, boosting the power source voltage VDD by means of a pumping operation utilizing a coupling capacity. The pumping circuit PUMP 1 operates when the boosted voltage VPP is lower than the reference voltage VPREF, and the enable signal VPENZ is activated. The pumping circuits PUMP 2 to 4 operate when the boosted voltage VPP is lower than the reference voltage VPREF. The VPP generation circuit 24 switches a drive capability of the boosted voltage VPP in accordance with the enable signal VPENZ.

Figure 4:
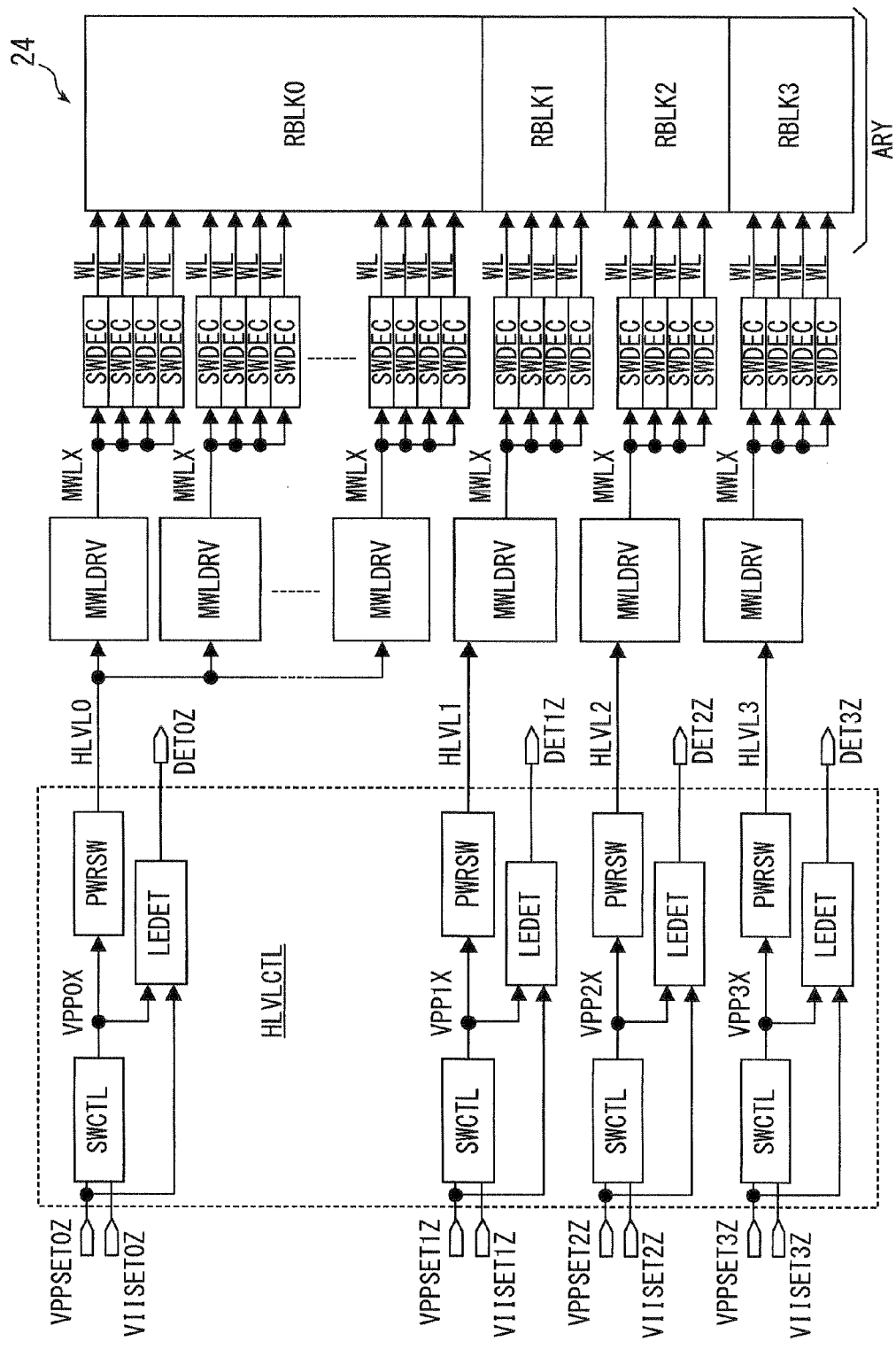
FIG. 4 illustrates an exemplary row control circuit.

FIG. 4 illustrates an exemplary row control circuit. The row control circuit illustrated in FIG. 4 may be the row control circuit RCTL illustrated in FIG. 1. The high level control circuit HLVLCTL includes a switch control circuit SWCTL, a power source switch circuit PWRSW, and a low edge detection circuit LEDET, corresponding to each of the row blocks RBLK 0 to 3.

Each main word line driver MWLDRV outputs the main word line signal MWLX in accordance with the row decode signal from the row decoder. When each row block RBLK 0 to 3 is accessed, one of the main word line signals MWLX corresponding to the row blocks RBLK 0 to 3 is activated to a low level. The high level voltage of the main word line signal MWLX may be the boosted voltage VPP or internal power source voltage VII supplied from the high level voltage line HLVL (HLVL 0 to 3). The low level voltage of the main word line signal MWLX may be the negative voltage VNN.

The sub-word decoder SWDEC which receives the low level main word line signal MWLX activates the sub-word line WL to a high level in accordance with the row decode signal from the row decoder. The activation level of the sub-word line WL may be the boosted voltage VPP. The deactivation level of the sub-word line WL may be the negative voltage VNN. Four sub-word lines WL are provided corresponding to one main word line MWL. A bit number of the row address signal RAD corresponding to the row decode signal for selecting the main word line driver MWLDRV may differ from a bit number of the row address signal RAD corresponding to the row decode signal for selecting the sub-word decoder SWDEC.

Figure 5:
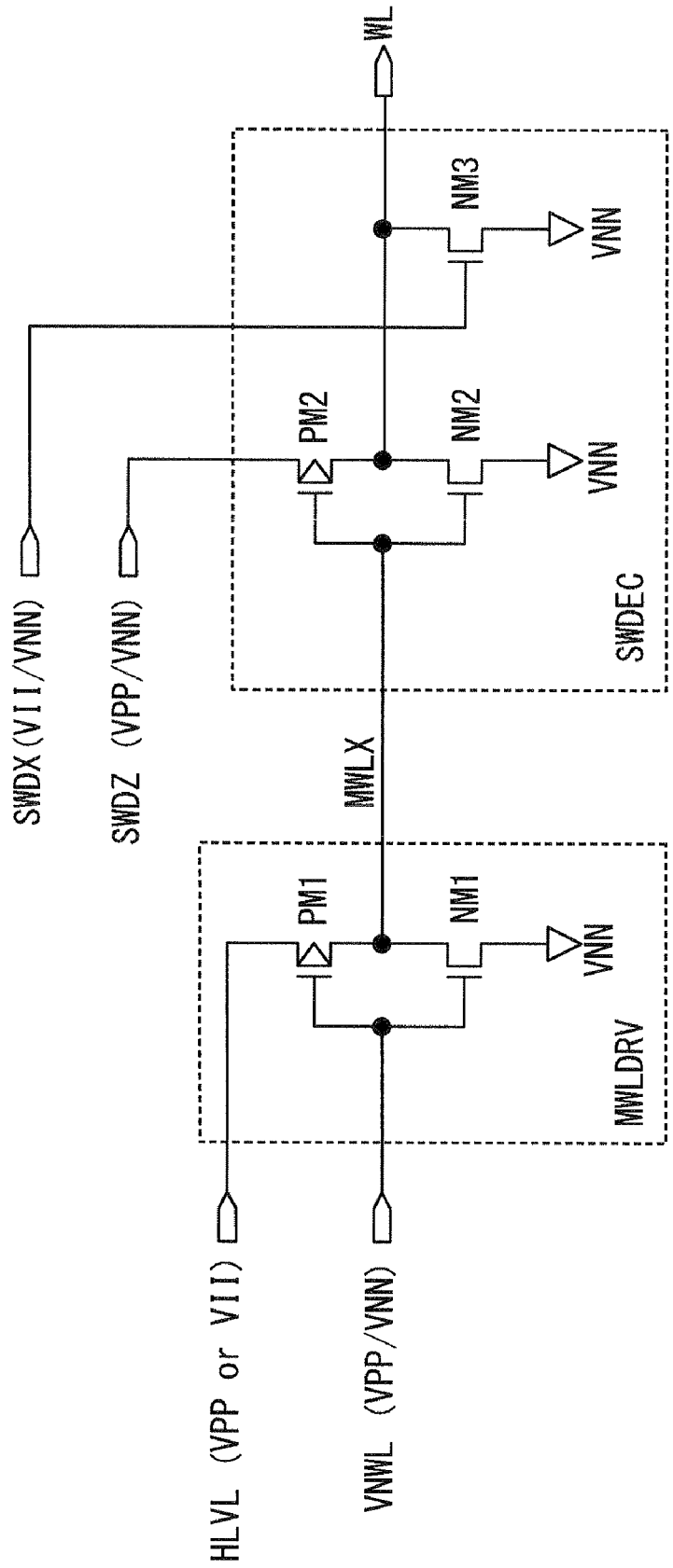
FIG. 5 illustrates an exemplary main word line driver and sub-word decoder.

FIG. 5 illustrates an exemplary main word line driver and an exemplary sub-word decoder. The main word line driver and sub-word decoder illustrated in FIG. 5 may be the main word line driver MWLDRV and sub-word decoder SWDEC illustrated in FIG. 4. The main word line driver MWLDRV includes a pMOS transistor PM1, whose source is coupled to the high level voltage line HLVL, and an nMOS transistor NM1, whose source is coupled to the negative voltage line VNN. The transistors PM1 and NM1 operate as a CMOS inverter. When a row decode signal VNWL, which is generated by predecoding an upper level row address signal RAD, is at a high level, for example, when in a selected state, the main word line driver MWLDRV activates the main word line signal MWLX to the low level VNN. When the row decode signal VNWL is at a low level, for example, when in an unselected state, the main word line driver MWLDRV deactivates the main word line signal MWLX to the high level VPP.

The sub-word decoder SWDEC includes a pMOS transistor PM2 and nMOS transistor NM2, disposed in series between a sub-word activation signal line SWDZ and the negative voltage line VNN, and an nMOS transistor NM3 disposed between the sub-word line WL and the negative voltage line VNN. The transistors PM2 and NM2 operate as a CMOS inverter. The gates of the transistors PM2 and NM2 are coupled to the main word line signal MWLX. The gate of the transistor NM3 receives a sub-word activation signal SWDX.

The transistor PM2 drives the sub-word line WL at the high level VPP. The transistors NM2 and NM3 set the sub-word line WL to the reset level VNN. A word reset signal WLRSTZ, when the sub-word line WL is unselected, sets the sub-word line WL to the negative voltage VNN.

When the sub-word line WL is in the unselected state, for example, at the VNN, the transistor PM2 of the sub-word decoder SWDEC receives the boosted voltage VPP or VII (MWLX) at the gate, and receives the negative voltage VNN (SWDZ, WL) at the source and drain. When the sub-word line WL is in the unselected state, for example, at the VNN, the transistor NM1 of the main word line driver MWLDRV receives the negative voltage VNN (VNWL) at the gate, and receives the boosted voltage VPP or VII (MWLX) at the drain. In the row block RBLK where the corresponding main word line MWLX is not selected, the high level voltage HLVL is set to the internal power source voltage VII. For this reason, the period when the GIDL current occurs in the transistors PM2 and NM1 may be minimized.

Figure 6:
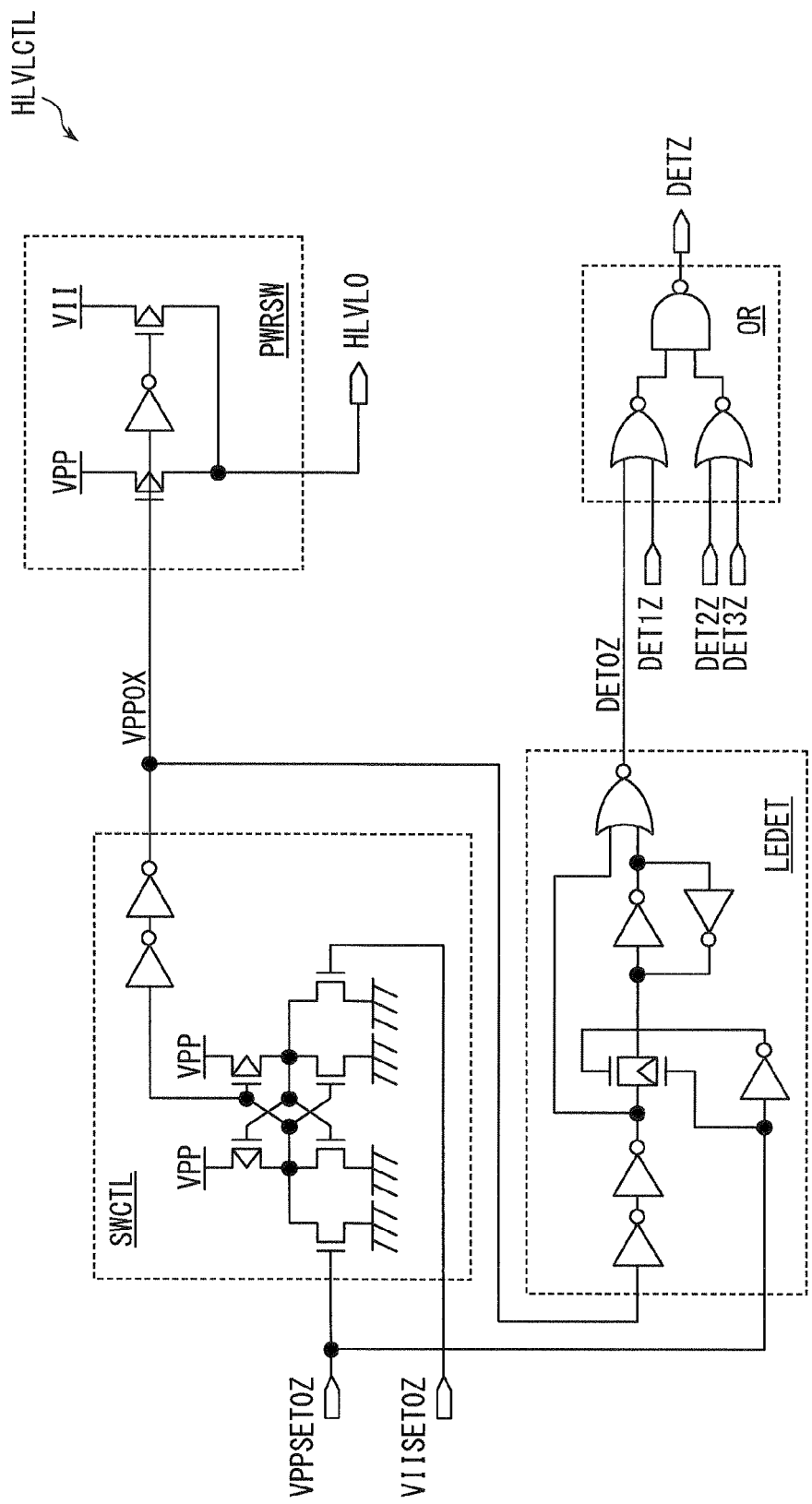
FIG. 6 illustrates an exemplary high level control circuit.

FIG. 6 illustrates an exemplary high level control circuit. The high level control circuit illustrated in FIG. 6 may be the high level control circuit HLVLCTL illustrated in FIG. 4. The high level control circuit includes the switch control circuit SWCTL, power source switch circuit PWRSW, and low edge detection circuit LEDET corresponding to the row block RBLK 0. The OR circuit may be disposed on the external side of the high level control circuit HLVLCTL. The OR circuit outputs the detection signal DETZ in synchronization with one of detection signals DET0Z to DET3Z. The switch control circuits SWCTL, power source switch circuits PWRSW, and low edge detection circuits LEDET corresponding to the row blocks RBLK 1 to 3 may be substantially the same as or similar to the switch control circuit SWCTL, power source switch circuit PWRSW, and low edge detection circuit LEDET illustrated in FIG. 6. The adjunct transistors may be pMOS transistors. The non-adjunct transistors may be nMOS transistors.

The switch control circuit SWCTL activates a high level setting signal VPP0X to a low level, for example, the VSS, in synchronization with a setting signal VPPSET0Z, for example, a pulse signal. The switch control circuit SWCTL deactivates the high level setting signal VPP0X to a high level, for example, the VPP, in synchronization with a setting signal VIISET0Z, for example, a pulse signal. The setting signals VPPSET0Z and VIISET0Z may be generated inside the row control circuit RCTL. The setting signal VPPSET0Z is generated when one of the sub-word lines WL of the row block RBLK0 is activated. The setting signal VPPSET0Z is generated in synchronization with the refresh signal REFZ corresponding to the row block RBLK0 and with the active signal ACTV corresponding to the row block RBLK0. The setting signal VIISET0Z is generated in synchronization with the refresh signal REFZ when, while the row block RBLK0 is deactivated, the switch block signal VIIBLK indicates the row block RBLK0. That the setting signals VPPSET1 to 3Z and VIISET1 to 3Z may be generated in substantially the same way as the setting signals VPPSET0Z and VIISET0Z.

The power source switch circuit PWRSW, when the high level setting signal VPP0X is at a low level, supplies the boosted voltage VPP to the high level voltage line HLVL0. The power source switch circuit PWRSW, when the high level setting signal VPP0X is at a high level, supplies the internal power source voltage VII to the high level voltage line HLVL0.

The low edge detection circuit LEDET, when the high level setting signal VPP0X changes from a high level to a low level in synchronization with the setting signal VPPSET0Z, outputs the detection signal DET0Z. The low edge detection circuit LEDET, when detecting the trailing edge of the high level setting signal VPP0X, outputs the detection signal DET0Z, which has a pulse width substantially the same as the pulse width of the setting signal VPPSET0Z.

Figure 7:
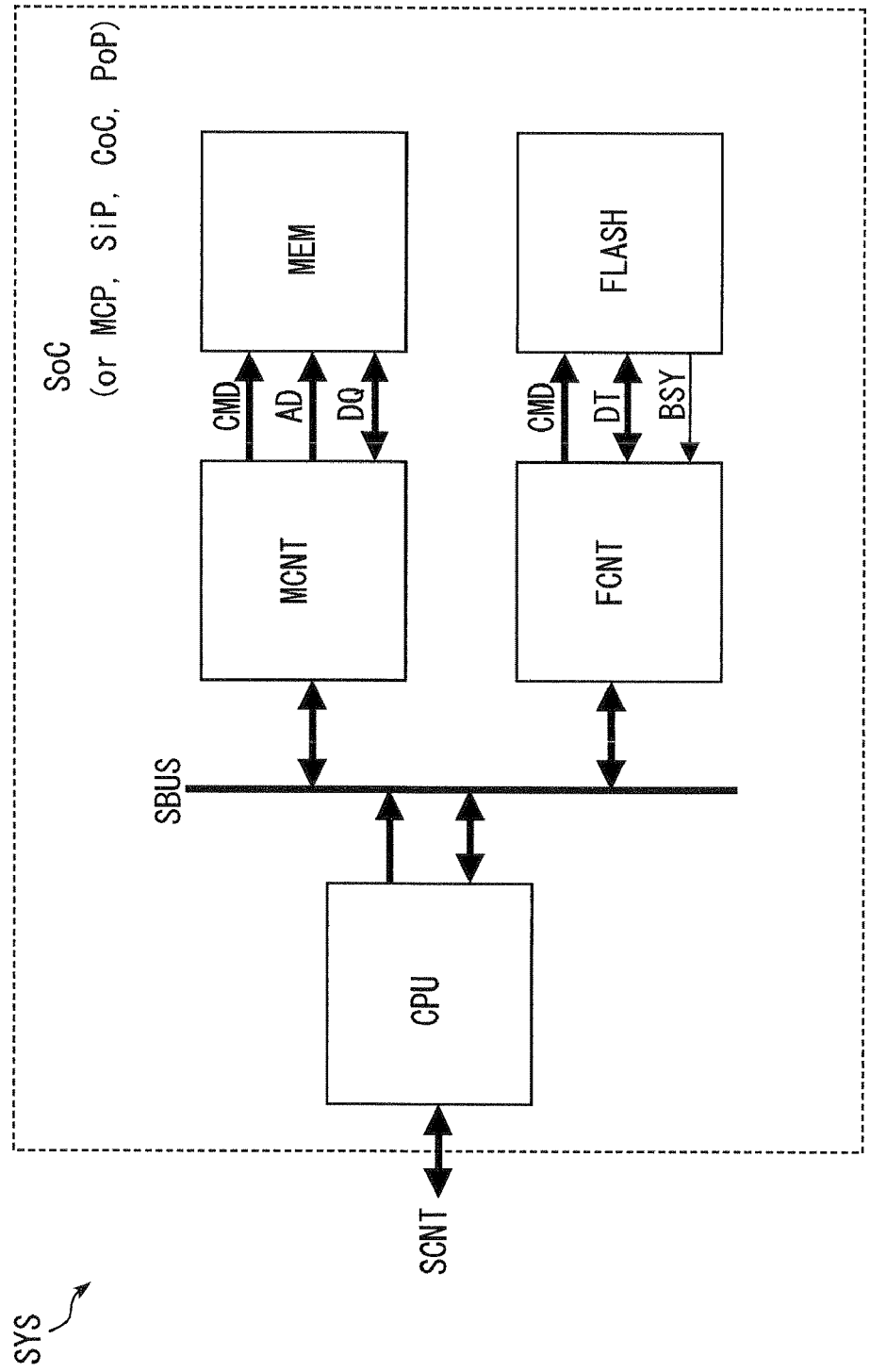
FIG. 7 illustrates an exemplary system including a semiconductor memory.

FIG. 7 illustrates an exemplary system including a semiconductor memory. The semiconductor memory illustrated in FIG. 7 may be the semiconductor memory MEM illustrated in FIG. 1. A system SYS (user system) includes at least one portion of a portable instrument, for example, a portable telephone or a portable game. The system SYS may include at least one portion of a computer device, such as a video recorder or personal computer. The following embodiments may be installed in the system SYS illustrated in FIG. 7.

The system SYS includes a system-on-chip SoC. The system SYS may include a multi-chip package MCP, a system-in-package SiP, a chip-on-chip CoC, a package-on-package PoP, or a printed substrate.

For example, the SoC includes the semiconductor memory MEM, a memory controller MCNT which accesses the semiconductor memory MEM, a flash memory FLASH, a memory controller FCNT which accesses the flash memory FLASH, and a CPU, for example, a main controller, which controls the entire system. The CPU, and the memory controllers MCNT and FCNT, are mutually coupled by a system bus SBUS. The SoC is coupled to an upper level system via an external bus SCNT. Another peripheral circuit chip may be coupled to the system bus SBUS.

The CPU, in order to access the semiconductor memory MEM, outputs a read packet, for example, a read access request, or a write packet, for example, a write access request, to the memory controller MCNT. The memory controller MCNT, based on the instruction from the CPU, outputs a command signal CMD, an address signal AD, or a write data signal DQ to the semiconductor memory MEM, and receives a read data signal DQ from the semiconductor memory MEM. When the semiconductor memory MEM is a DRAM, the memory controller MCNT periodically outputs a refresh command to the semiconductor memory MEM.

The CPU, in order to access the flash memory FLASH, outputs a read packet, for example, a read access request, a write packet, for example, a write access request, or a delete packet, for example, a delete request, to the memory controller FCNT. The memory controller FCNT, in response to the instruction from the CPU, outputs a command signal CMD and a write data signal DT to the flash memory FLASH, and receives a read data signal DT and a busy signal BSY from the flash memory FLASH. An address signal is transmitted to the flash memory FLASH via a data line DT.

The command signal CMD and address signal AD may be output to the semiconductor memory MEM from the CPU. The system SYS may include the CPU and semiconductor memory MEM. The CPU operates as a memory controller.

Figure 8:
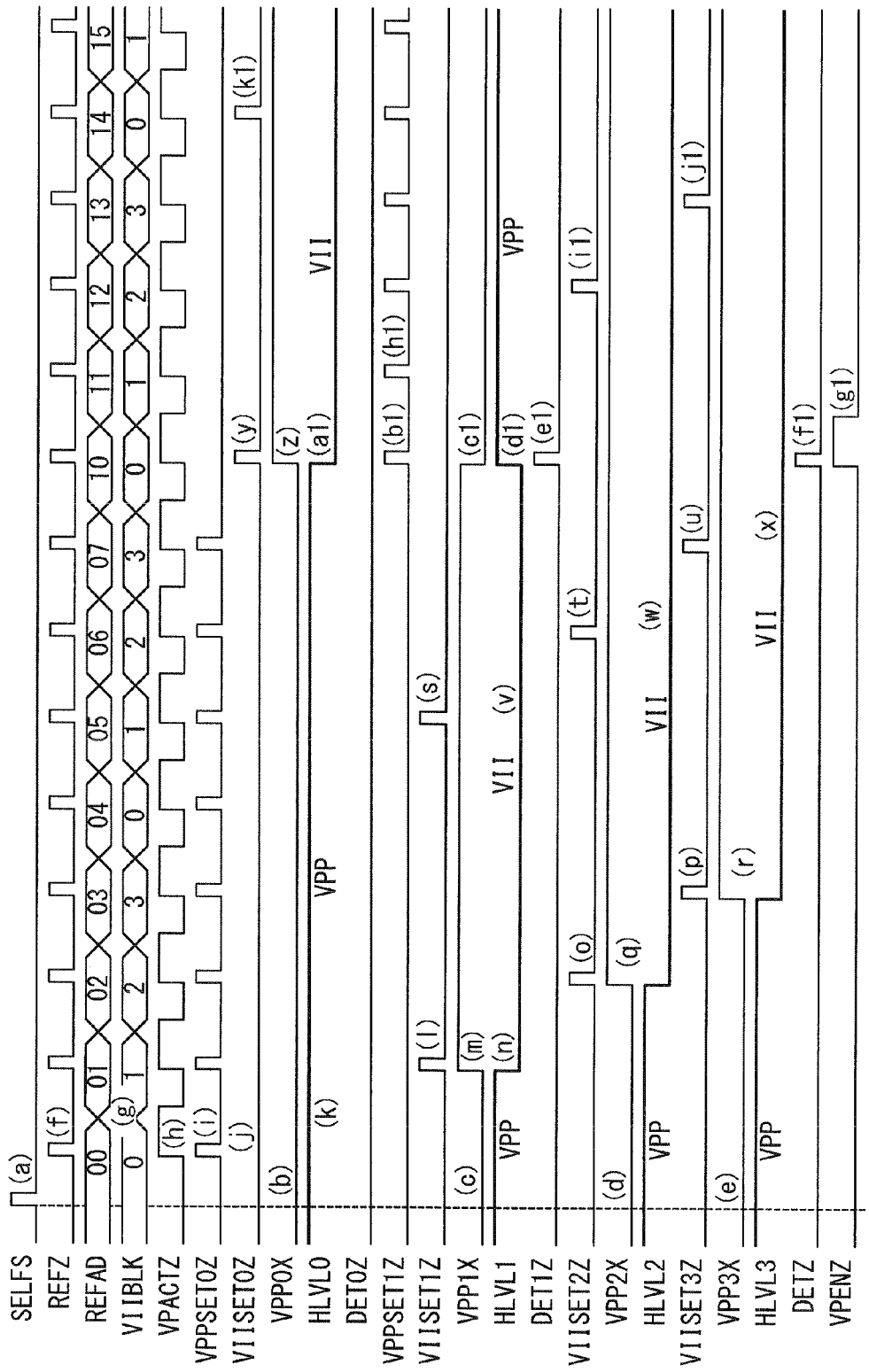
FIG. 8 illustrates an exemplary operation of a refresh control circuit, an exemplary VPP generation circuit, and an exemplary high level control circuit.

FIG. 8 illustrates an exemplary operation of a refresh control circuit, VPP generation circuit, and high level control circuit. The refresh control circuit, VPP generation circuit, and high level control circuit illustrated in FIG. 8 may be the refresh control circuit 16 illustrated in FIG. 2, the VPP generation circuit 24 illustrated in FIG. 3, and the high level control circuit HLVLCTL illustrated in FIG. 6. The command decoder 14, on receiving a self refresh command from the memory controller MCNT via the command terminal, outputs the refresh start signal SELFS, for example, a pulse signal (FIG. 8 (a)). The semiconductor memory MEM enters the self refresh mode, for example, the standby mode. When starting the self refresh mode, the high level setting signals VPP0X to VPP3X of the row blocks RBLK0 to RBLK3 are set to a low level (FIG. 8 (b) to (e)). For this reason, the high level voltage lines HLVL0 to HLVL3 are set to the boosted voltage VPP.

In the self refresh mode, the oscillator OSC illustrated in FIG. 2 operates, periodically outputting the refresh signal REFZ (FIG. 8 (f)). For example, the refresh address signal REFAD and switch block signal VIIBLK are updated after a given time in response to the trailing edge of the refresh signal REFZ (FIG. 8 (g)). For this reason, the self refresh operation is performed using the refresh address signal REFAD before it is updated. While the row block RBLK (one of RBLK0 to RBLK3) is performing the refresh operation, for example, during the active period of the row block RBLK, the active signal VPACTZ is activated (FIG. 8 (h)).

In FIG. 8, the upper digit of the refresh address signal REFAD indicates the number of the row block RBLK where the refresh operation is performed. The lower digit indicates the number of the sub-word line WL to which is coupled the memory cell MC where the refresh operation is performed. For example, each row block RBLK0 to RBLK3 may include eight sub-word lines WL0 to 7. Each row block RBLK0 to RBLK3 may include, for example, 256 sub-word lines WL0 to 255. The numeral of the switch block signal VIIBLK indicates the number of the row block RBLK where the high level voltage of the main word line MWLX is lowered from the boosted voltage VPP to the internal power source voltage VII.

When the semiconductor memory MEM enters the self refresh mode, the refresh address signal REFAD indicates the sub-word line WL0 of the row block RBLK0. For this reason, when the sub-word lines WL0 to 7 of the row block RBLK0 are activated, the setting signal VPPSET0Z is activated eight times consecutively (FIG. 8 (i)). The refresh operation of the row block RBLK0 is performed eight times consecutively. After the sub-word lines WL0 to 7 of one row block RBLK are sequentially selected, the self refresh operation is performed while switching the row block RBLK. In the normal operation mode, an auto refresh operation performed in response to an external refresh command is the same. The row block RBLK where the refresh operation is performed may be called a refresh block.

At the time of a first refresh operation, the numeral of the switch block signal VIIBLK indicates the row block RBLK0. As the row block RBLK0 is activated, the setting signal VIISET0Z is not generated (FIG. 8 (j)). For this reason, the high level setting signal VPP0X is held at a low level and the high level voltage HLVL0 having the boosted voltage VPP is supplied to the main word line driver MWLDRV (FIG. 8 (k)).

At the time of a second refresh operation, the numeral of the switch block signal VIIBLK indicates the row block RBLK1. As the row block RBLK1 is deactivated, the setting signal VIISET1Z is activated in synchronization with the refresh signal REFZ (FIG. 8 (l)). The switch control circuit SWCTL corresponding to the row block RBLK1 is deactivated from the high level setting signal VPP1X to a high level in synchronization with the setting signal VIISET1Z (FIG. 8 (m)). For this reason, the high level voltage HLVL1 supplied to the main word line driver MWLDRV corresponding to the row block RBLK1 is switched from the boosted voltage VPP to the internal power source voltage VII (FIG. 8 (n)). In the self refresh mode, the GIDL current occurring in the main word line driver MWLDRV corresponding to the row block RBLK1 may be reduced.

At the time of third and fourth refresh operations, the setting signals VIISET2Z and 3Z corresponding to the row blocks RBLK2 and 3 are sequentially generated (FIGS. 8 (o) and (p)), and the high level voltages HLVL2 and HLVL3 are sequentially switched from the boosted voltage VPP to the internal power source voltage VII (FIGS. 8 (q) and (r)). Subsequently, while the row block RBLK0 is the refresh block, the setting signals VIISET1Z to 3Z are sequentially generated (FIG. 8 (s) to (u)). The high level voltage HLVL0 is held at the internal power source voltage VII (FIG. 8 (v) to (x)). In the self refresh mode, the GIDL current occurring in the main word line driver MWLDRV corresponding to the row blocks RBLK2 and 3 may be reduced.

With an eighth refresh operation, the refresh operations of all the sub-word lines WL0 to 7 of the row block RBLK0 are completed. The refresh block is shifted from the row block RBLK0 to the row block RBLK1. A ninth refresh operation is performed with respect to the memory cell MC coupled to the sub-word line WL0 of the row block RBLK1. The switch block signal VIIBLK indicates the row block RBLK0. As the row block RBLK0 is deactivated, the setting signal VIISET0Z is activated in synchronization with the refresh signal REFZ (FIG. 8 (y)). The high level setting signal VPP0X is deactivated to a high level (FIG. 8 (z)), and the high level voltage HLVL0 is switched from the boosted voltage VPP to the internal power source voltage VII (FIG. 8 (a1)). For this reason, in the self refresh mode, the GIDL current occurring in the main word line driver MWLDRV corresponding to the row block RBLK0 may be reduced.

As the row block RBLK1 is the refresh block, the setting signal VPPSET1Z is activated in synchronization with the ninth refresh signal REFZ (FIG. 8 (*b*1)). The switch control circuit SWCTL corresponding to the row block RBLK1 activates the high level setting signal VPP1X to a low level in synchronization with the setting signal VPPSET1Z (FIG. 8 (*c*1)). For this reason, the high level voltage HLVL1 supplied to the main word line driver MWLDRV corresponding to the row block RBLK1 is switched from the internal power source voltage VII to the boosted voltage VPP (FIG. 8 (*d*1)).

The low edge detection circuit LEDET corresponding to the row block RBLK1 outputs the detection signal DET1Z in synchronization with the trailing edge of the high level setting signal VPP1X (FIG. 8 (*e*1)). For this reason, the detection signal DETZ is output (FIG. 8 (*f*1)). The detection signal DETZ is output by detecting that the high level voltage HLVL1 supplied to the word lines MWLX and WL is switched from the internal power source voltage VII to the boosted voltage VPP.

The enable control circuit ENCTL illustrated in FIG. 3 activates the enable signal VPENZ to a high level in synchronization with the detection signal DETZ (FIG. 8 (*g*1)). The activated period of the enable signal VPENZ is substantially equivalent to one refresh operation cycle. While the enable signal VPENZ is at the high level, the pumping circuit PUMP1 operates and generates the boosted voltage VPP. By the boosted voltage VPP being generated using the four pumping circuits PUMP1 to PUMP4, the supply capability of the boosted voltage VPP is increased.

As the supply capability of the boosted voltage VPP is set high when the high level voltage HLVL1 is switched from the internal power source voltage VII to the boosted voltage VPP, the high level voltage line HLVL1 rises swiftly to the boosted voltage VPP. When each row block RBLK0 to RBLK3 includes 256 sub-word lines WL, the high level voltage line HLVL1 is coupled to 64 main word line drivers MWLDRV, and the burden may be large. Even when the burden is large, as the supply capability of the boosted voltage VPP increases, the switching from the internal power source voltage VII to the boosted voltage VPP is carried out swiftly. While the high level voltage line HLVL1 is held at the boosted voltage VPP, The supply capability of the boosted voltage VPP may be relatively low. As the boosted voltage VPP is generated at a low supply capability except for when switching from the internal power source voltage VII to the boosted voltage VPP, the consumption current of the semiconductor memory MEM may be reduced. In particular, the consumption current in the self refresh mode, for example, the standby current, may be reduced.

In the row block RBLK1 where the refresh operation is executed, the setting signal VPPSET1Z is sequentially generated (FIG. 8 (*h*1)). In the row blocks RBLK0, 2 and 3, where the refresh operation is not executed, the setting signals VIISET0Z, 2Z and 3Z corresponding to the numerals of the switch block signal VIIBLK are sequentially generated (FIG. 8 (*i*1 to *k*1)).

Figure 9:
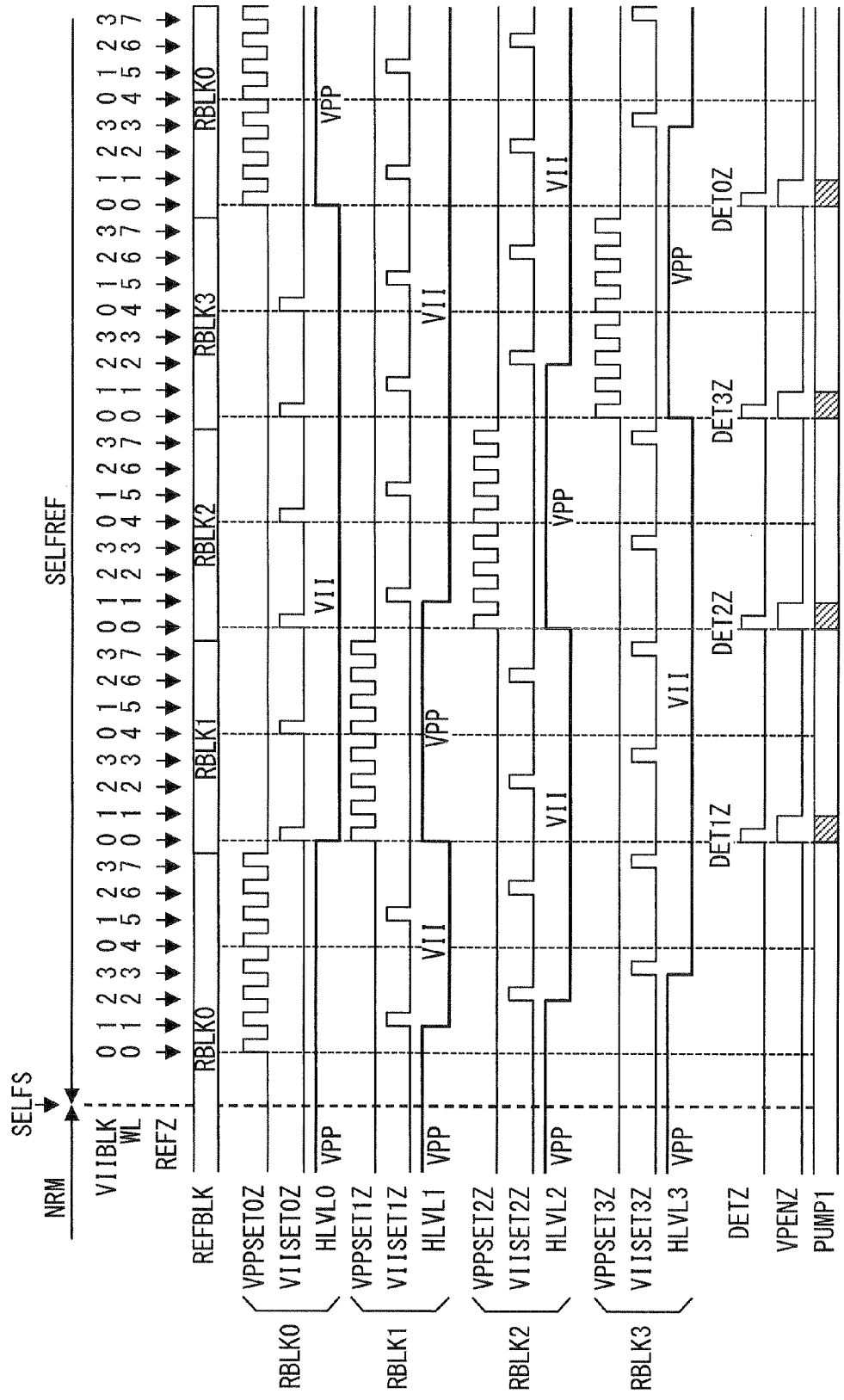
FIG. 9 illustrates an exemplary switching operation.

FIG. 9 illustrates an exemplary switching operation. The operation illustrated in FIG. 9 may be the operation when the semiconductor memory illustrated in FIG. 1 switches from the normal operation mode NRM to the self refresh mode SELFREF. As far as the refresh operation of the sixth sub-word line WL (WL5) when the refresh block REFBLK is the row block RBLK1, the operation may be substantially the same as, or similar to, the refresh operation illustrated in FIG. 8. The diagonal lines illustrated in the pumping circuit PUMP1 indicate a period in which the pumping circuit PUMP1 operates. The pumping circuit PUMP1 operates when the voltage of the high level voltage lines HLVL0 to HLVL3 corresponding to one of the row blocks RBLK0 to RBLK3 is switched from the internal power source voltage VII to the boosted voltage VPP.

Figure 10:
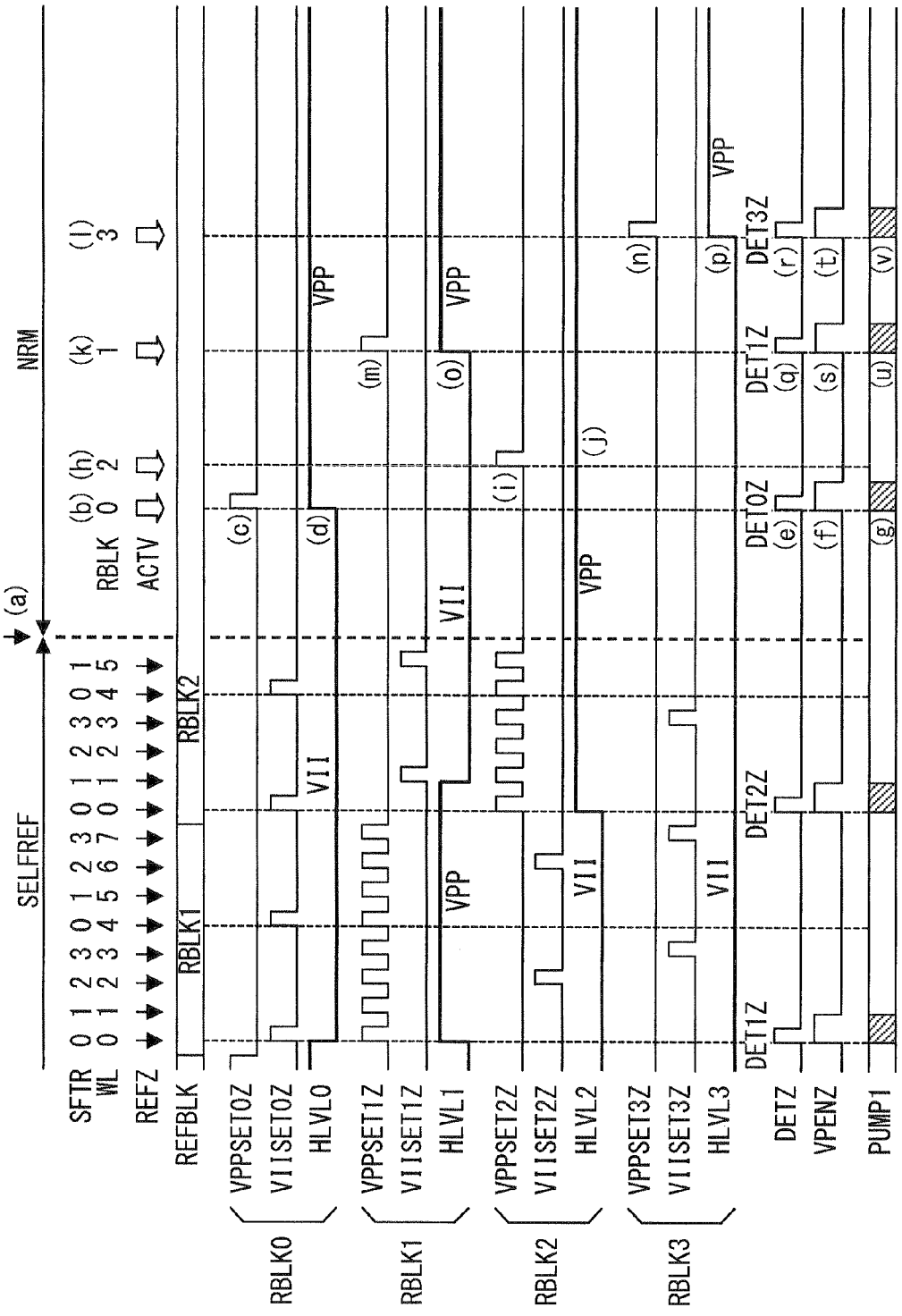
FIG. 10 illustrates an exemplary switching operation.

FIG. 10 illustrates an exemplary switching operation. The operation illustrated in FIG. 10 may, for example, be the operation when the semiconductor memory illustrated in FIG. 1 switches from the self refresh mode SELFREF to the normal operational mode NRM. The switching operation illustrated in FIG. 10 may be a continuation of the switching operation illustrated in FIG. 9.

The command decoder 14, when receiving a self refresh end command from the memory controller MCNT via the command terminal CMD, outputs the refresh end signal SELFE, for example, a pulse signal (FIG. 10 (*a*)). The semiconductor memory MEM exits the self refresh mode SELFREF, for example, the standby mode, and returns to the normal operation mode NRM, for example, the active mode. In the normal operation mode NRM, the active command ACTV, or another command, is supplied from outside the semiconductor memory MEM.

The memory controller MCNT supplies an active command ACTV in order to access the row block RBLK0 (FIG. 10 (*b*)). The active command ACTV is indicated by a white arrow. The row control circuit RCTL activates the setting signal VPPSET0Z in response to the active command ACTV (FIG. 10 (*c*)). The switch control circuit SWCTL corresponding to the row block RBLK0 activates the high level setting signal VPP0X to a low level in synchronization with the setting signal VPPSET0Z. The high level voltage HLVL0 is switched from the internal power source voltage VII to the boosted voltage VPP (FIG. 10 (*d*)).

The low edge detection circuit LEDET corresponding to the row block RBLK0 outputs the detection signal DET0Z in synchronization with the trailing edge of the high level setting signal VPP0X (FIG. 10 (*e*)). The detection signal DETZ is output, and the enable signal VPENZ is activated in synchronization with the detection signal DETZ (FIG. 10 (*f*)). The activation period of the enable signal VPENZ may be substantially equivalent to one read operation cycle or one write operation cycle. While the enable signal VPENZ is at a high level, the pumping circuit PUMP1 operates and generates the boosted voltage VPP (FIG. 10 (*g*)). The diagonal lines illustrated in the pumping circuit PUMP1 indicate a period in which the pumping circuit PUMP1 operates. In this period, the VPP generation circuit 24 generates the boosted voltage VPP using the four pumping circuits PUMP1 to PUMP4. For this reason, the drive capability of the VPP generation circuit 24 increases.

The active command ACTV is supplied in order to access the row block RBLK2 (FIG. 1 (*h*)). The setting signal VPPSET2Z is activated in synchronization with the active command ACTV (FIG. 10 (*i*)). Since the high level voltage HLVL2 corresponding to the row block RBLK2 is set to the boosted voltage VPP at the point of returning to the normal operation mode NRM (FIG. 10 (*j*), the voltage switching operation is not executed, and the detection signal DET2Z is not output.

The active command ACTV is sequentially supplied in order to access the row blocks RBLK1 and RBLK3 (FIGS. 10 (*k*) and (*l*)). The setting signals VPPSET1Z and 3Z are sequentially activated in response to the active command ACTV (FIGS. 10 (*m*) and (*n*)). The high level voltages HLVL1 and HLVL3 are sequentially switched from the internal power source voltage VII to the boosted voltage VPP (FIGS. 10 (*o*) and (*p*)).

Along with the high level voltages HLVL1 and HLVL3 being switched to the boosted voltage VPP, the detection signals DET1Z and DET3Z are sequentially output (FIGS. 10

(*q*) and (*r*)). For this reason, the detection signal DETZ is output. The enable signal VPENZ is sequentially activated in synchronization with the detection signal DETZ (FIGS. 10 (*s*) and (*t*)). While the enable signal VPENZ is at a high level, the pumping circuit PUMP1 operates and generates the boosted voltage VPP (FIGS. 10 (*u*) and (*v*)). In this period, the drive capability of the VPP generation circuit 24 increases.

In the normal operation mode NRM, since the boosted voltage VPP is generated using the four pumping circuits PUMP1 to PUMP4 when switching from the internal power source voltage VII to the boosted voltage VPP, the boosted voltage VPP rises swiftly. Since the boosted voltage VPP is generated at a low supply capability except for when switching from the internal power source voltage VII to the boosted voltage VPP, the consumption current of the semiconductor memory MEM may be reduced.

Figure 11:
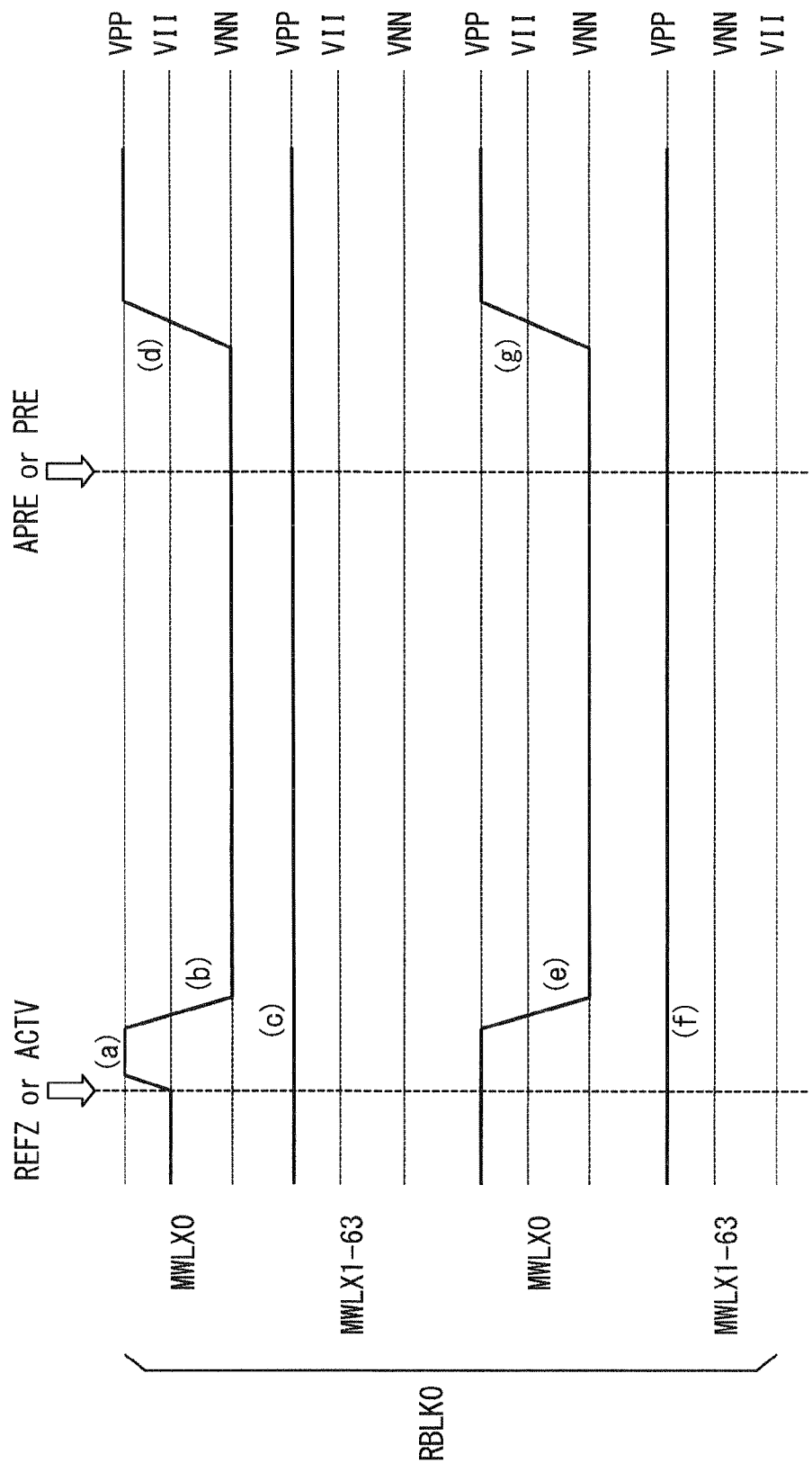
FIG. 11 illustrates an exemplary a refresh operation or an exemplary active operation.

FIG. 11 illustrates an exemplary refresh operation or an exemplary active operation. The operation illustrated in FIG. 11 may be a refresh operation or active operation of the semiconductor memory MEM illustrated in FIG. 1. The refresh operation includes an operation responding to the refresh command REF, and an operation in the self refresh mode. The active operation may be an operation responding to the active command ACTV. For example, the main word line MWLX0 of the row block RBLK0 is selected. The main word lines MWLX0 to 63 of the other row blocks RBLK1 to 3, which are not accessed, are held at the internal power source voltage VII or boosted voltage VPP.

For example, before the refresh operation and active operation, the high level voltage HLVL0 (MWLX0) illustrated in FIG. 4 is set at the internal power source voltage VII. The high level voltage HLVL0 is switched to the boosted voltage VPP in synchronization with the refresh signal REFZ or active signal ACTV (FIG. 11 (*a*)). Subsequently, the main word line MWLX0 changes to the negative voltage VNN (FIG. 11 (*b*)). The other main word lines MWLX1 to 63 corresponding to the row block RBLK0 are held at the boosted voltage VPP (FIG. 11 (*c*)). After the completion of the refresh operation, the core control circuit 22 automatically generates an auto precharge signal APRE. The semiconductor memory MEM, when finishing the active operation, receives the precharge signal PRE from the memory controller MCNT, via the command terminal CMD. The main word line driver MWLDRV, in response to the auto precharge signal APRE or precharge signal PRE, changes the main word line MWLX0 to the boosted voltage VPP (FIG. 11 (*d*)).

For example, before the refresh operation and active operation, the high level voltage HLVL0 (MWLX0) is set at the boosted voltage VPP. The main word line MWLX0 changes to the negative voltage VNN in synchronization with the refresh signal REFZ or active signal ACTV (FIG. 11 (*e*)). The other main word lines MWLX1 to 63 corresponding to the row block RBLK0 are held at the boosted voltage VPP (FIG. 11 (*f*)). Subsequently, the main word line driver MWLDRV, in response to the auto precharge signal APRE or precharge signal PRE, changes the main word line MWLX0 to the boosted voltage VPP (FIG. 11 (*g*)).

The memory controller MCNT supplies the precharge signal PRE to the semiconductor memory MEM at an optional timing. For this reason, the timings of the auto precharge signal APRE and precharge signal PRE generation may differ. The refresh operation period and active operation period may differ from each other.

Figure 12:
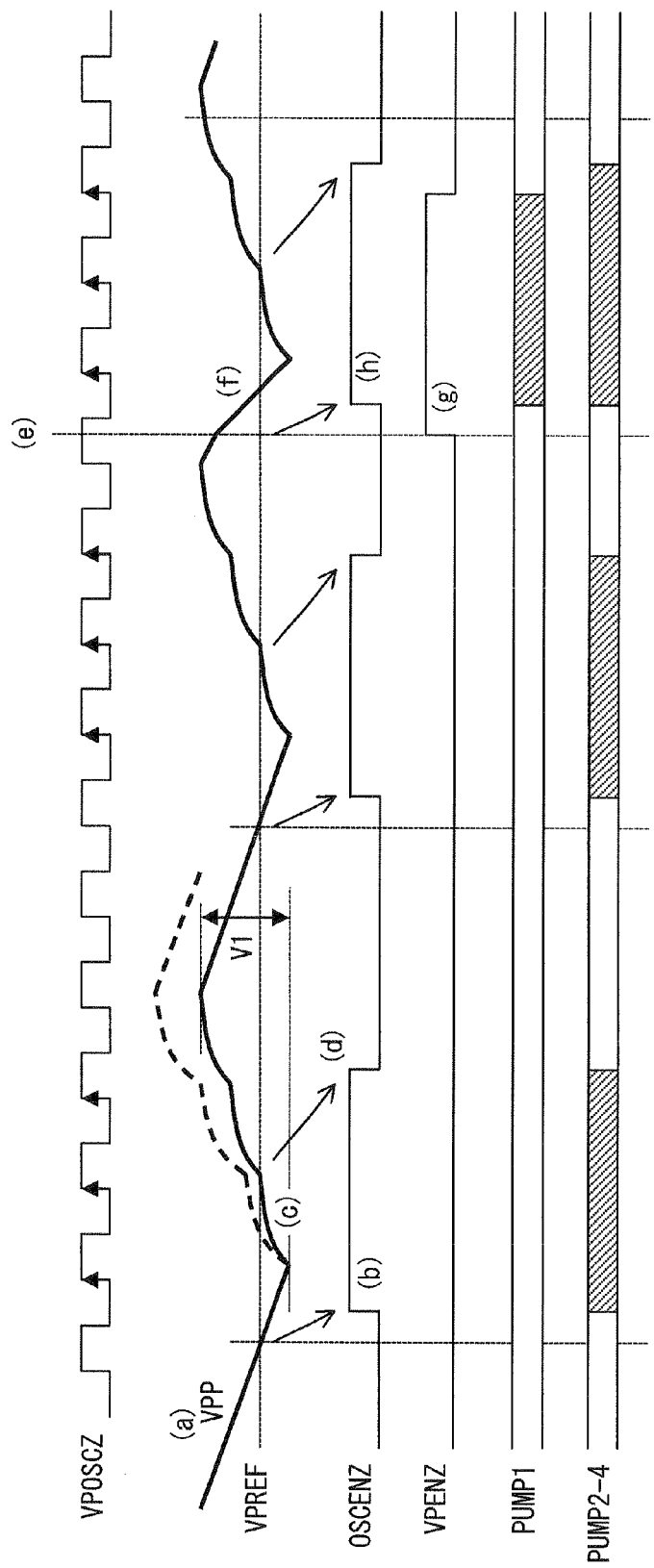
FIG. 12 illustrates an exemplary operation of a VPP generation circuit.

FIG. 12 illustrates an exemplary operation of a VPP generation circuit. The VPP generation circuit illustrated in FIG. 12 may be the VPP generation circuit 24 illustrated in FIG. 3. For example, the boosted voltage VPP may drop at the steep rate illustrated in FIG. 12. The diagonal lines illustrated in the pumping circuits PUMP1 to PUMP4 indicate periods in which the pumping circuits PUMP1 to PUMP4 operate. The blank periods illustrated in the pumping circuits PUMP1 to PUMP4 indicate periods in which the pumping circuits PUMP1 to PUMP4 do not operate. For example, FIG. 12 may indicate periods before and after the high level voltage line HLVL, for example, one of HLVL0 to HLVL3, is switched from the internal power source voltage VII to the boosted voltage VPP in FIGS. 8 to 10. The enable signal VPENZ is activated when the high level voltage line HLVL is switched from the internal power source voltage VII to the boosted voltage VPP.

When the pumping circuits PUMP1 to PUMP4 are stopped, the boosted voltage VPP gradually drops due to an operation of the main word line driver MWLDRV, sub-word decoder SWDEC, or the like (FIG. 12 (*a*)). The level detection circuit LVLDET activates the oscillation enable signal OSCENZ when the boosted voltage VPP becomes lower than the reference voltage VPREF (FIG. 12 (*b*)).

When the oscillation enable signal OSCENZ is at a high level, the pumping circuits PUMP2 to PUMP4 operate and generate the boosted voltage VPP. The boosted voltage VPP gradually rises due to the operation of the pumping circuits PUMP2 to PUMP4 (FIG. 12 (*c*)). The level detection circuit LVLDET deactivates the oscillation enable signal OSCENZ when the boosted voltage VPP becomes substantially equal to or higher than the reference voltage VPREF (FIG. 12 (*d*)).

There may be a time difference from the boosted voltage VPP actually becoming substantially equal to or higher than the reference voltage VPREF to the pumping circuits PUMP2 to PUMP4 stopping. For example, the pumping circuits PUMP2 to PUMP4 execute three pumping operations for every detection by the level detection circuit LVLDET. The arrows illustrated in the oscillation signal VPOSCZ indicate the pumping operations of the pumping circuits PUMP2 to PUMP4. Due to the intermittent operations of the pumping circuits PUMP2 to PUMP4, the boosted voltage VPP produces a ripple of a voltage V1.

When the boosted voltage VPP is generated by the same number of pumping circuits, the supply capability of the pumping circuit may be higher than the supply capability of the pumping circuits PUMP2 to PUMP4 illustrated in FIG. 3. The pumping circuit may need the supply capability of the boosted voltage VPP when the high level voltage line HLVL, for example, one of HLVL0 to HLVL3, is switched from the internal power source voltage VII to the boosted voltage VPP. As illustrated by the heavy broken line in FIG. 12, the boosted voltage VPP ripple of a pumping circuit with a high supply capability may become large.

When the boosted voltage VPP ripple becomes large, maximum value of the boosted voltage VPP increases, and a transistor which receives the boosted voltage VPP may deteriorate. For example, the transistors of the main word line driver MWLDRV and sub-word decoder SWDEC illustrated in FIG. 5 may deteriorate. A holding property of data held in the memory cell MC may worsen. When a stabilizing capacity coupled to the boosted voltage line VPP is increased in order to reduce the boosted voltage VPP ripple, a chip size of the semiconductor memory MEM may increase. For example, the pumping circuit PUMP1, which operates when the high level voltage line HLVL is switched from the internal power source voltage VII to the boosted voltage VPP, is provided. For this reason, the deterioration of the transistor may be reduced, the data holding property may improve, or the chip size may be reduced.

When the high level voltage line HLVL, for example, one of HLVL0 or HLVL1, is switched from the internal power source voltage VII to the boosted voltage VPP (FIG. 12 (e)), the boosted voltage VPP drops (FIG. 12 (f)). Due to the switching to the boosted voltage VPP, the enable signal VPENZ is activated for a given period (FIG. 12 (g)). As the boosted voltage VPP becomes lower than the reference voltage VPREF, the oscillation enable signal OSCENZ is activated (FIG. 12 (h)). For this reason, the pumping circuits PUMP1 to PUMP4 start operating, and the drive capability of the boosted voltage VPP increases. The pumping circuit PUMP1 operates in order to compensate for the drop in the boosted voltage VPP accompanying the switch to the boosted voltage VPP. For this reason, when the enable signal VPENZ is activated in the boosted voltage VPP being comparatively high, the boosted voltage VPP ripple does not become large.

The pumping circuits PUMP2 to PUMP4 operate in a period in which the boosted voltage VPP is lower than the reference voltage VPREF. When the high level voltage line HLVL is switched from the internal power source voltage VII to the boosted voltage VPP in this period, all the pumping circuits PUMP1 to PUMP4 may operate. The pumping circuit PUMP1 operates in order to compensate for the reduction in the boosted voltage VPP accompanying the switch of the high level voltage line HLVL. When the enable signal VPENZ is activated in the period in which the boosted voltage VPP is lower than the reference voltage VPREF, and all the pumping circuits PUMP1 to PUMP4 operate, a waveform of the boosted voltage VPP may be substantially the same as, or similar to, the waveform illustrated in FIG. 12 (c). Due to the operation of the pumping circuit PUMP1, the boosted voltage VPP ripple does not become large.

As the period in which the drive capability of the VPP generation circuit 24 increases becomes shorter, the consumption current of the VPP generation circuit 24 decreases. For this reason, the semiconductor memory MEM consumption current is reduced. When the memory core 34 is switched from the self refresh mode SELFREF to the normal operation mode NRM, and the main word line MWLX of each row block RBLK0 to RBLK3 is changed from the internal power source voltage VII to the boosted voltage VPP, the pumping circuit PUMP1 operates. The drive capability of the pumping circuit PUMP1 increases when the supply capability of the boosted voltage VPP is insufficient. For this reason, a fluctuation in the boosted voltage VPP, when the drive capability of the VPP generation circuit 24 is changed, may be reduced.

In a period in which the enable signal VPENZ is not activated, the drive capability of the VPP generation circuit 24 is low. For this reason, the boosted voltage VPP ripple becomes small, and the maximum value of the boosted voltage VPP decreases. The deterioration of the transistor to which the boosted voltage VPP is supplied may be reduced. A leakage current of the transistor is reduced, and the data holding property of the memory cell MC may improve. As the boosted voltage VPP ripple is suppressed, the stabilization capacity is reduced and the chip size of the semiconductor memory MEM decreases.

Figure 13:
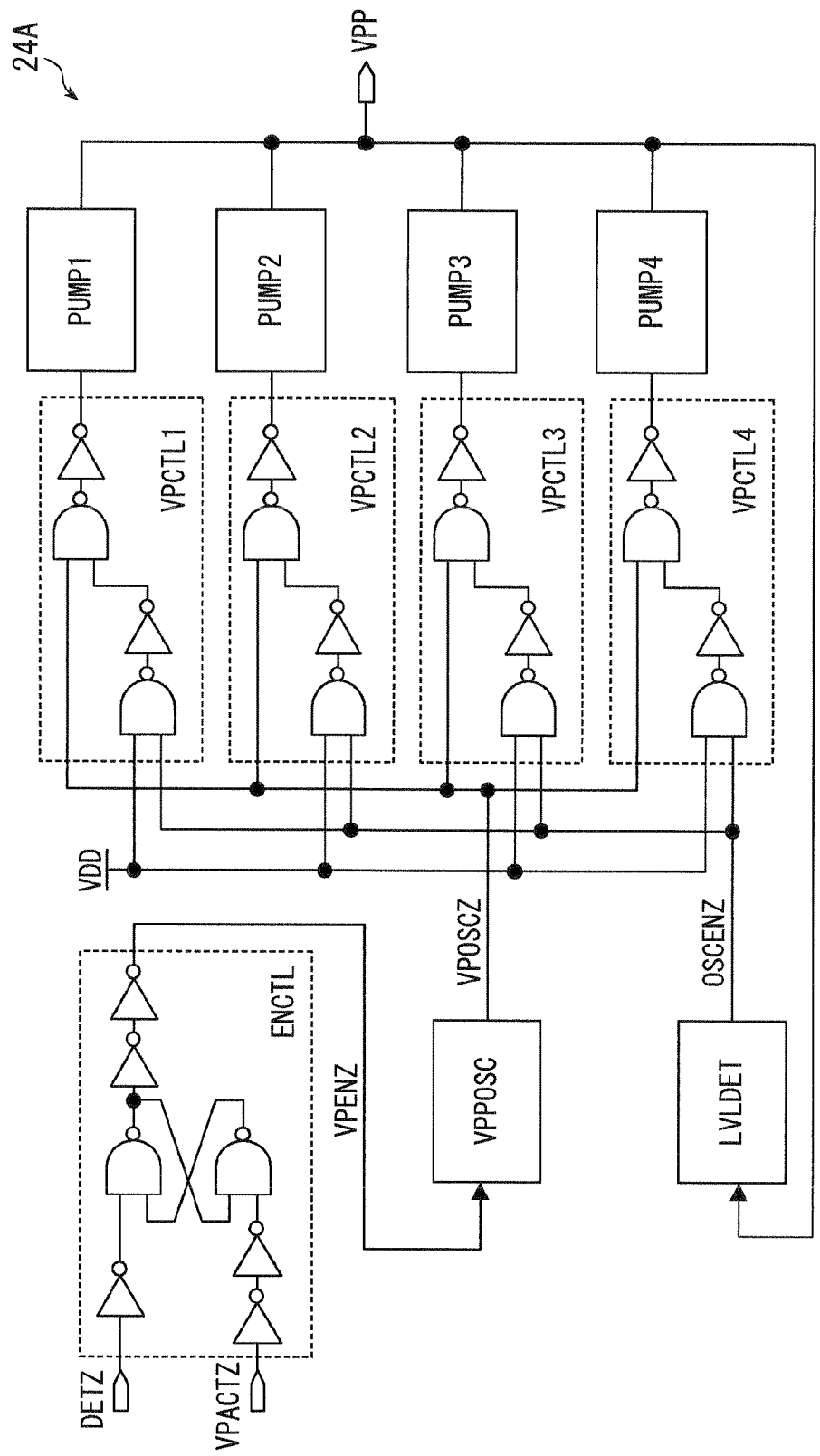
FIG. 13 illustrates a second embodiment.

FIG. 13 illustrates a second embodiment. In the second embodiment, identical reference numbers and characters are given to components substantially identical to the previous components, and, therefore, descriptions of these components in the section that follows are omitted or reduced to avoid redundancy. For example, a semiconductor memory MEM may be an SDRAM. The semiconductor memory MEM may operate in synchronization with a clock signal CLK, and may operate asynchronously with respect to the clock signal CLK. The semiconductor memory MEM may include a memory macro (IP) installed in a system LSI or the like, and may include a semiconductor storage device enclosed in a package. For example, the semiconductor memory MEM may be installed in the system SYS illustrated in FIG. 7.

The semiconductor memory MEM includes a VPP generation circuit 24A. The other configuration of the semiconductor memory illustrated in FIG. 13 may be substantially the same as, or similar to, the configuration illustrated in FIG. 1. In the VPP generation circuit 24A, an enable signal VPENZ output from an enable control circuit ENCTL is supplied to an oscillator VPPOSC. In a pump control circuit VPCTL1, the other input of a NAND gate which receives an oscillation enable signal OSCENZ is coupled to a power source line VDD. Pumping circuits PUMP1 to PUMP4 operate in synchronization with each other. The other configuration of the VPP generation circuit 24A may be substantially the same as, or similar to, the configuration of the VPP generation circuit 24 illustrated in FIG. 3. The operation of the semiconductor memory MEM may be substantially the same as, or similar to, the operation illustrated in FIGS. 8 to 10.

The oscillator VPPOSC, while receiving a high level enable signal VPENZ, raises the frequency of an oscillation signal VPOSCZ. The oscillator VPPOSC, while receiving a low level enable signal VPENZ, lowers the frequency of an oscillation signal VPOSCZ. The oscillator VPPOSC shortens an oscillation period when the enable signal VPENZ is at a high level, and lengthens the oscillation period when the enable signal VPENZ is at a low level. For this reason, in a period in which the enable signal VPENZ is at a high level, a supply capability of a boosted voltage VPP due to the pumping circuits PUMP1 to PUMP4 increases. For example, the frequency of the oscillation signal VPOSCZ when the enable signal VPENZ is at a low level may be substantially the same as that of the semiconductor memory MEM illustrated in FIG. 1. The frequency of the oscillation signal VPOSCZ when the enable signal VPENZ is at a high level may be 1.5 times the frequency when the enable signal VPENZ is at a low level.

Figure 14:
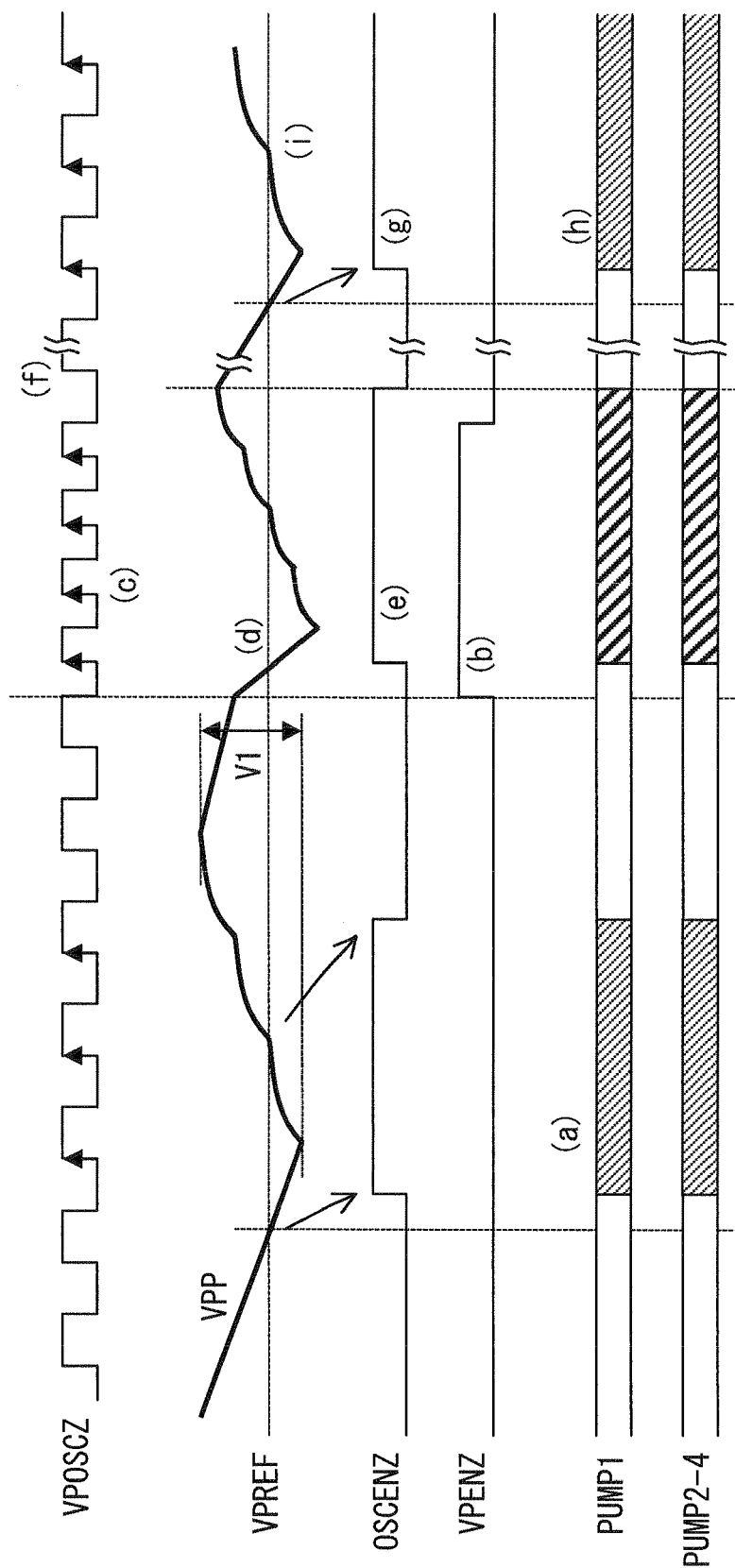
FIG. 14 illustrates an exemplary operation of a VPP generation circuit.

FIG. 14 illustrates an exemplary operation of a VPP generation circuit. The VPP generation circuit illustrated in FIG. 14 may be the same as the VPP generation circuit 24A illustrated in FIG. 13. For example, the boosted voltage VPP may drop at a steep rate. The thin diagonal lines illustrated in the pumping circuits PUMP1 to PUMP4 indicate periods in which the pumping circuits PUMP1 to PUMP4 operate at a low frequency. The thick diagonal lines illustrated in the pumping circuits PUMP1 to PUMP4 indicate periods in which the pumping circuits PUMP1 to PUMP4 operate at a high frequency, for example, periods in which the supply capability of the boosted voltage VPP is high. The blank periods illustrated in the pumping circuits PUMP1 to PUMP4 indicate periods in which the pumping circuits PUMP1 to PUMP4 do not operate. FIG. 14 may indicate periods before and after the high level voltage line HLVL, for example, one of HLVL0 to HLVL3, is switched from the internal power source voltage VII to the boosted voltage VPP in FIGS. 8 to 10.

The pumping circuits PUMP2 to PUMP4 and the pumping circuit PUMP1 operate in the VPP generation circuit 24A due to an activation of the oscillation enable signal OSCENZ. The other operation is substantially the same as, or similar to, the operation illustrated in FIG. 12 (FIG. 14 (a)). By the supply capability of the boosted voltage VPP of each pumping circuit PUMP1 to PUMP4 being set at, for example, 75% of the supply capability illustrated in FIG. 3, a ripple V1 may be substantially the same as the ripple V1 illustrated in FIG. 12.

The enable signal VPENZ, as illustrated in FIGS. 8 to 10, is activated for a given period when the high level voltage HLVL, for example, one of HLVL0 to HLVL3, is switched from the internal power source voltage VII to the boosted voltage VPP (FIG. 14 (b)). The frequency of the oscillation signal VPOSCZ increases in a period in which the enable signal VPENZ is at a high level (FIG. 14 (c)). Similar to FIG. 12, when the high level voltage line HLVL, for example, one of HLVL0 or HLVL1, is switched from the internal power source voltage VII to the boosted voltage VPP, the boosted voltage VPP drops (FIG. 14 (d)). As the boosted voltage VPP becomes lower than the reference voltage VPREF, the oscillation enable signal OSCENZ is activated (FIG. 14 (e)). For this reason, the pumping circuits PUMP1 to PUMP4 start operating in a condition where the frequency of the oscillation signal VPOSCZ is high, and the drive capability of the boosted voltage VPP increases. The drop in the boosted voltage VPP accompanying the switch to the boosted voltage VPP is compensated for by the increase in the frequency of the oscillation signal VPOSCZ. When the enable signal VPENZ is activated in the boosted voltage VPP being substantially high, the boosted voltage VPP ripple does not become large. When the enable signal VPENZ is deactivated, the frequency of the oscillation signal VPOSCZ returns to its original level (FIG. 14 (f)). Subsequently, when the boosted voltage VPP becomes lower than the reference voltage VPREF, the oscillation enable signal OSCENZ is activated again (FIG. 14 (g)). The pumping circuits PUMP1 to PUMP4 operate (FIG. 14 (h)), and the boosted voltage VPP rises (FIG. 14 (i)).

The second embodiment achieves substantially the same advantage as the previous embodiment. When the high level voltage HLVL is switched from the internal power source voltage VII to the boosted voltage VPP, the frequency of the oscillation signal VPOSCZ, which makes the pumping circuits PUMP1 to PUMP4 to operate, is set high. For this reason, the semiconductor memory MEM consumption current may be reduced.

Figure 15:
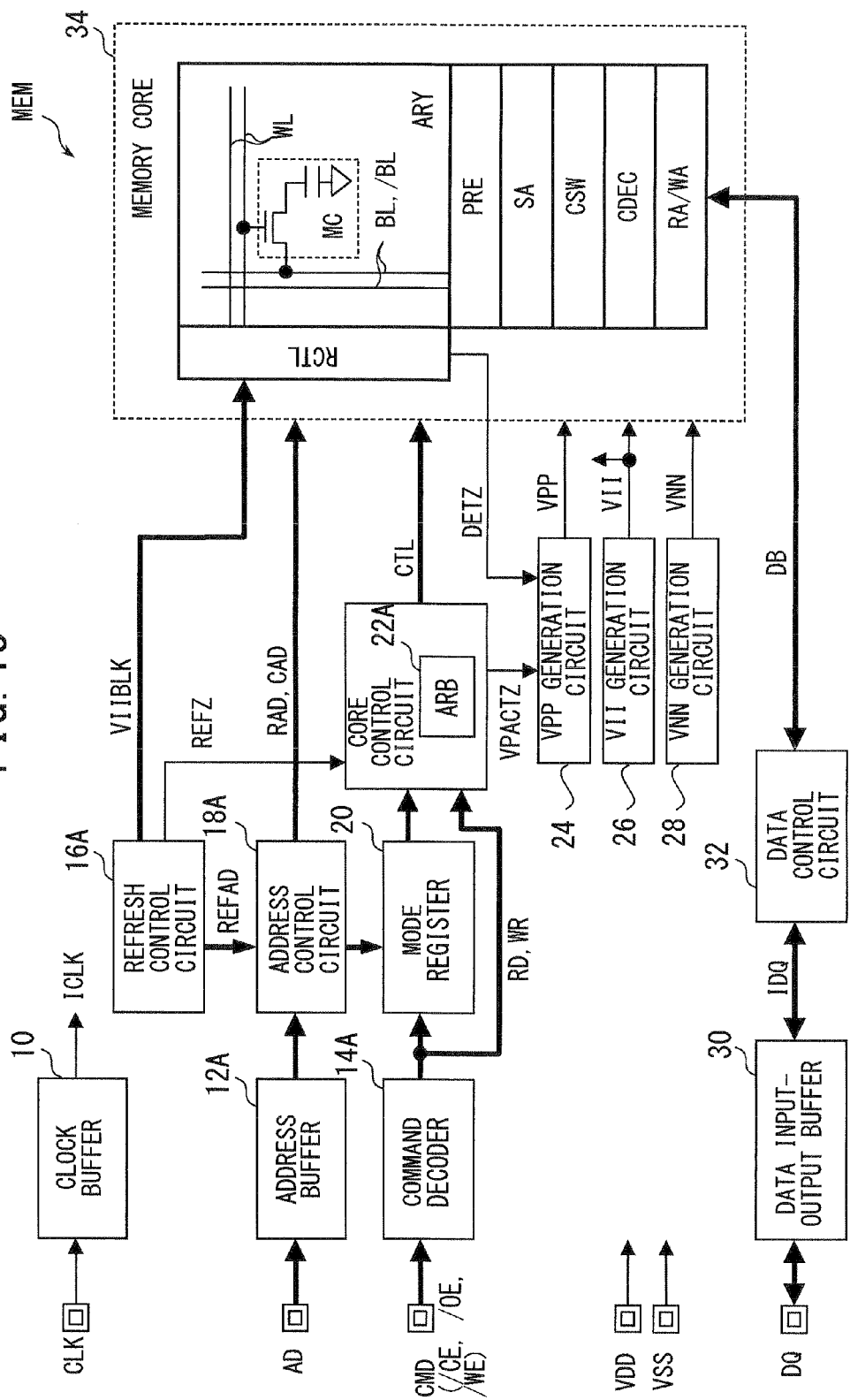
FIG. 15 illustrates a third embodiment.

FIG. 15 illustrates a third embodiment. In the third embodiment, identical reference numbers and characters are given to components substantially identical to the components of the previous embodiment, and, therefore, descriptions of these components in the section that follows are omitted or reduced to avoid redundancy. For example, a semiconductor memory MEM may be a pseudo-SRAM. The pseudo-SRAM includes a DRAM memory core, and an SRAM interface. The pseudo-SRAM, without receiving a refresh command from outside, regularly performs a refresh operation inside a chip, and holds data written into a memory cell.

The semiconductor memory MEM may operate in synchronization with a clock signal CLK, and may operate asynchronously with the clock signal CLK. The semiconductor memory MEM may include a memory macro (IP) installed in a system LSI or the like, and may include a semiconductor storage device enclosed in a package. For example, the semiconductor memory MEM may be installed in the system SYS illustrated in FIG. 7.

The memory MEM includes an address buffer 12A, a command decoder 14A, a refresh control circuit 16A, an address control circuit 18A, and a core control circuit 22A. The address buffer 12A, command decoder 14A, refresh control circuit 16A, address control circuit 18A, and core control circuit 22A illustrated in FIG. 15 may correspond to the address buffer 12, command decoder 14, refresh control circuit 16, address control circuit 18, and core control circuit 22 illustrated in FIG. 1. The other configuration may be substantially the same as, or similar to, the configuration illustrated in FIG. 1.

The address buffer 12A contemporaneously receives a row address signal RAD and a column address signal CAD in differing address terminals AD. The memory MEM may employ a non-multiplex type address.

The command decoder 14A receives a chip enable signal/CE, an output enable signal/OE, and a write enable signal/WE as a command signal CMD. The command decoder 14A decodes the received signal, and outputs an internal command signal for causing the memory core 34 to operate. The internal command signal includes a read signal RD, a write signal WR, and a mode register setting signal.

The refresh control circuit 16A may not include the latch circuit LT illustrated in, for example, FIG. 2. An oscillator OSC of the refresh control circuit 16A outputs a refresh signal REFZ in a given cycle regardless of the operation mode, and updates a refresh address signal REFAD, and a switch block signal VIIBLK, in synchronization with the refresh signal REFZ. The pseudo-SRAM may not receive a refresh command from the memory controller MCNT. The refresh control circuit 16A may not receive the refresh signal REF illustrated in FIG. 2. The refresh signal REFZ may be generated in synchronization with the output from the oscillator OSC.

The address control circuit 18A, outputs address signals AD contemporaneously received from the address buffer 12A, as a row address signal RAD or a column address signal CAD. The address control circuit 18A outputs a refresh address signal REFAD from the refresh control circuit 16 as a row address signal RAD.

The core control circuit 22A, in accordance with a read signal RD, a write signal WR, or a refresh signal REFZ, for example, an internal refresh command, outputs a control signal CTL which controls an operation of the memory core 34. An access operation, for example, one of a read operation, a write operation, or a refresh operation, is performed by the control signal CTL. The core control circuit 22A includes an arbiter ARB which decides an order of precedence when a read signal RD or a write signal WR, for example, an external access command, and a refresh signal REFPZ compete. The core control circuit 22A outputs a control signal CTL for executing a read operation, a write operation, or a refresh operation in accordance with the order of precedence determined by the arbiter ARB.

The core control circuit 22A, in response to each of the read signal RD, write signal WR, and refresh signal REFPZ, activates an active signal VPACTZ at a high level for a given period. For example, the given period may be a period substantially equivalent to one cycle of the read operation, write operation, and refresh operation.

Figure 16:
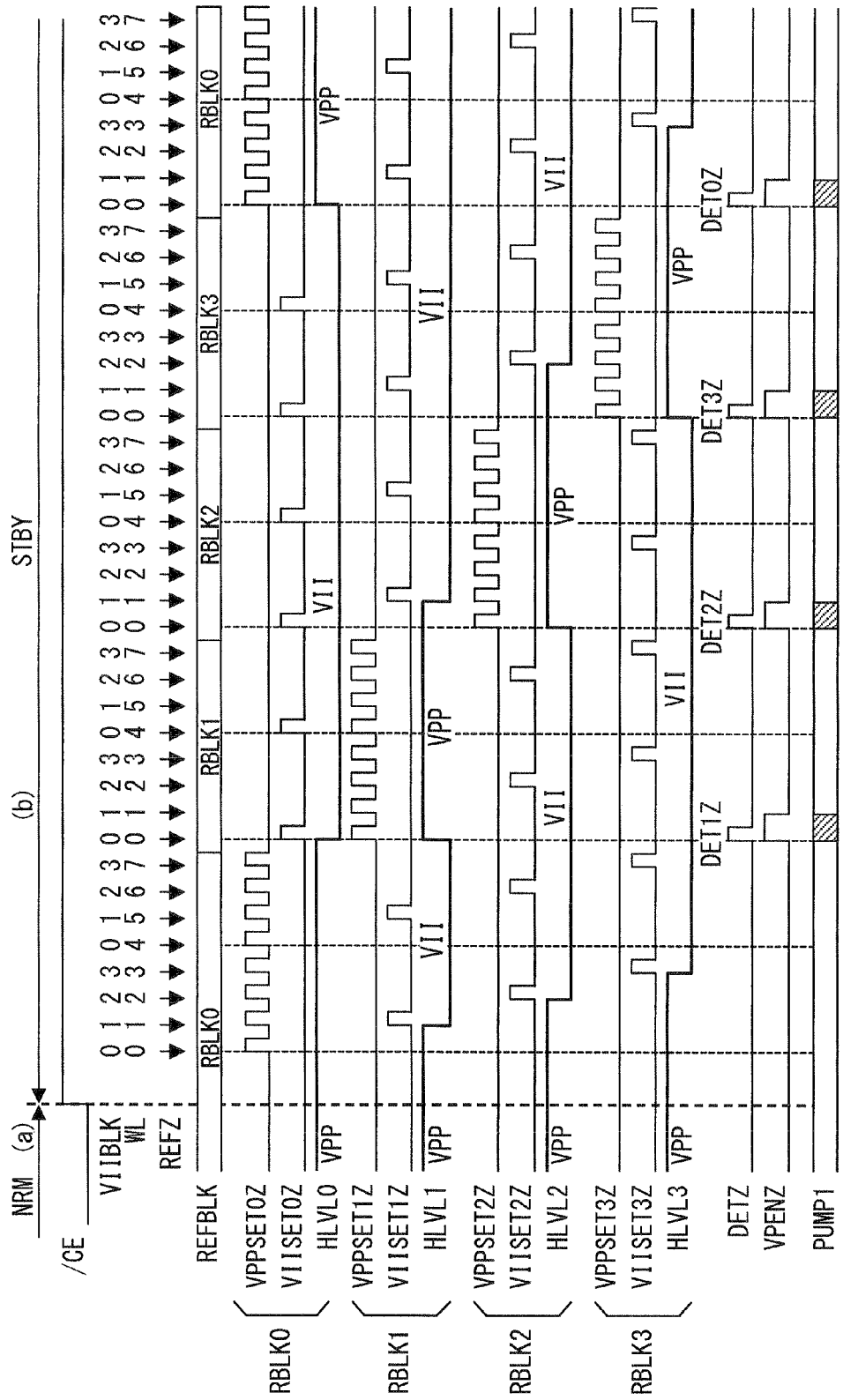
FIG. 16 illustrates an exemplary switching operation.

FIG. 16 illustrates an exemplary switching operation. The switching operation of the semiconductor memory illustrated in FIG. 16 may be the operation of the semiconductor memory illustrated in FIG. 15 switching from the normal operation mode NRM to the standby mode STBY. Here the operation illustrated in FIG. 9 may be applied. To avoid redundancy, its description in this context is omitted or reduced. The semiconductor memory MEM is set to a normal operation mode NRM, for example, the active mode, in a period in which the chip enable signal/CE from the memory controller MCNT is at a low level (FIG. 16 (a)). The semiconductor memory MEM is set to the standby mode STBY in a period in which the chip enable signal/CE is at a high level (FIG. 16 (b)). An operation in the standby mode STBY is substantially the same as, or similar to, the operation illustrated in FIG. 9. The refresh signal REFZ may be output, for example, every several microseconds, or several tens of microseconds.

Figure 17:
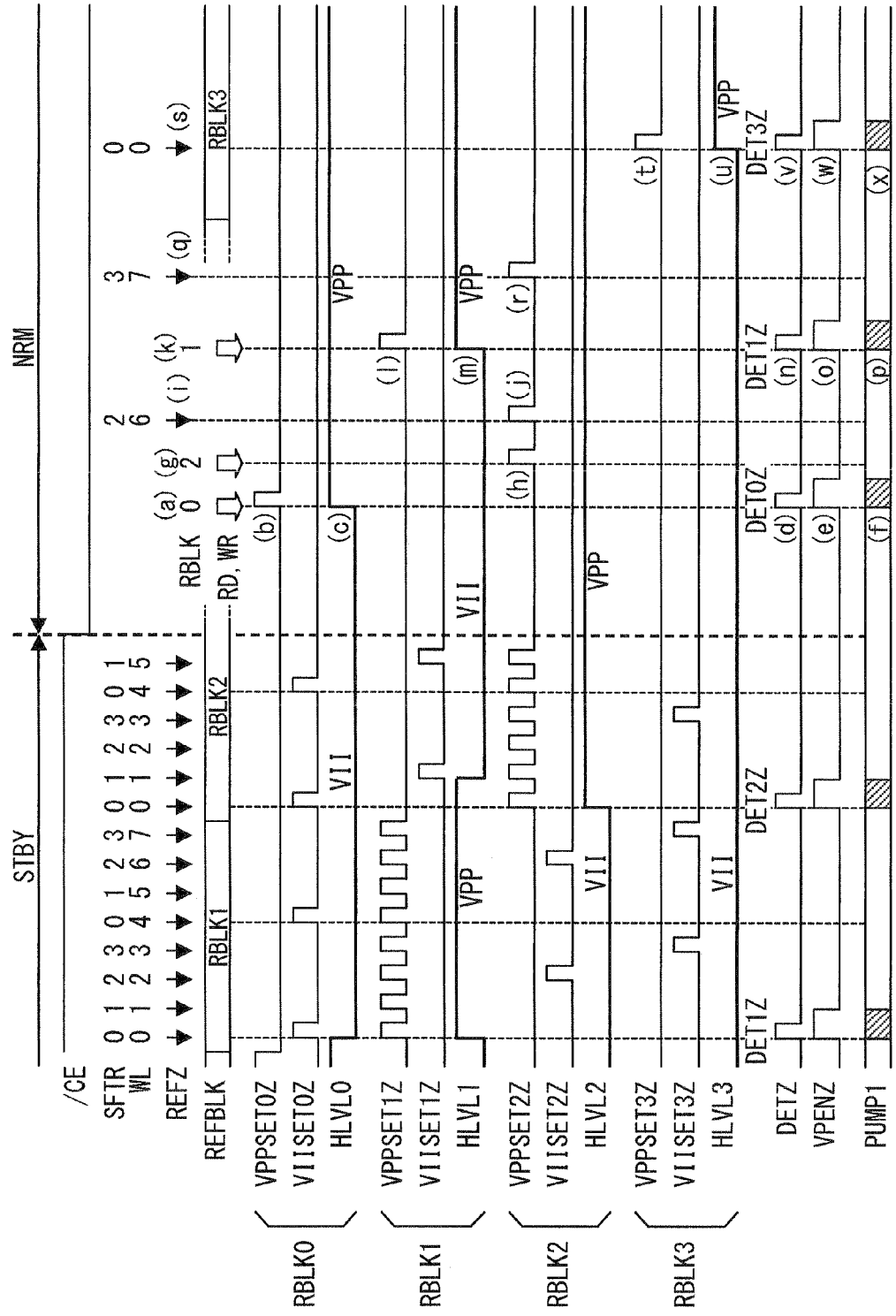
FIG. 17 illustrates an exemplary switching operation.

FIG. 17 illustrates an exemplary switching operation. The switching operation illustrated in FIG. 17 may be the operation of the semiconductor memory illustrated in FIG. 15 switching from the standby mode STBY to the normal operation mode NRM. The operation illustrated in FIG. 17 may be a continuation of the operation illustrated in FIG. 16. A description of an operation in FIG. 17 substantially the same as, or similar to, the operation illustrated in FIG. 10 will be omitted or reduced to avoid redundancy. The refresh signal REFZ may be output, for example, every several microseconds, or several tens of microseconds, in the normal operation mode NRM. A refresh signal REFZ interval in the normal operation mode NRM may be indicated to be long in comparison with in the standby mode STBY. An operation in the standby mode STBY may be substantially the same as, or similar to, the operation in the self refresh mode SELFREF illustrated in FIG. 10.

In the normal operation mode NRM, a row block RBLK0 access command, for example, a read command or a write command is supplied to the semiconductor memory MEM (FIG. 17 (a)). The access command is indicated by a white arrow. In the same way as in FIG. 10, the row control circuit RCTL may activate the setting signal VPPSET0Z in response to the access command (FIG. 17 (b)). The switching control circuit SWCTL corresponding to the row block RBLK0 activates the high level setting signal VPP0X to a low level in synchronization with the setting signal VPPSET0Z. The high level voltage HLVL0 is switched from the internal power source voltage VII to the boosted voltage VPP (FIG. 17 (c)).

In the same way as in FIG. 10, detection signals DET0Z and DETZ may be output, and an enable signal VPENZ may be activated in synchronization with the detection signal DETZ (FIGS. 17 (d) and (e)). An activation period of the enable signal VPENZ may be substantially equivalent to, for example, one read operation cycle, one write operation cycle, or one refresh operation cycle. The pumping circuit PUMP1 operates and generates the boosted voltage VPP while the enable signal VPENZ is at a high level (FIG. 17 (f)).

An access command is supplied in order to access the row block RBLK2, and the setting signal VPPSET2Z is activated (FIG. 17 (g) and (h)). As the high level voltage HLVL2 corresponding to the row block RBLK2 is set to the boosted voltage VPP, the detection signal DETZ may not be output.

The refresh signal REFZ is output, and the refresh operation is executed (FIG. 17 (i)). As the refresh block REFBLK is the row block RBLK2, the setting signal VPPSET2Z is activated (FIG. 17 (j)). As the high level voltage HLVL2 corresponding to the row block RBLK2 is set to the boosted voltage VPP, the detection signal DETZ may not be output. The numeral of the switch block signal VIIBLK output from the shift register SFTR may be, for example, "2". The row control circuit RCTL prohibits an output of the setting signal VIISET in the normal operation mode. For this reason, the high level voltage HLVL2 may not switch from the boosted voltage VPP to the internal power source voltage VII.

An access command is supplied in order to access the row block RBLK1, and the setting signal VPPSET1Z is activated (FIGS. 17 (k) and (l)). The switch control circuit SWCTL corresponding to the row block RBLK1 activates the high level setting signal VPP1X to a low level in synchronization with the setting signal VPPSET1Z. The high level voltage HLVL1 is switched from the internal power source voltage VII to the boosted voltage VPP (FIG. 17 (m)). The detection signals DET1Z and DETZ are output, and the enable signal VPENZ is activated in synchronization with the detection signal DETZ (FIGS. 17 (n) and (o)). The pumping circuit PUMP1 operates and generates the boosted voltage VPP while the enable signal VPENZ is at a high level (FIG. 17 (p)).

The refresh signal REFZ is output, and the refresh operation is executed (FIG. 17 (q)). As the refresh block REFBLK is the row block RBLK2, the setting signal VPPSET2Z is activated (FIG. 17 (r)). As the high level voltage HLVL2 corresponding to the row block RBLK2 is set to the boosted voltage VPP, the detection signal DETZ may not be output.

The refresh signal REFZ is output, and the refresh operation is executed (FIG. 17 (s)). As the refresh block REFBLK is the row block RBLK3, the setting signal VPPSET3Z is activated (FIG. 17 (t)). The switch control circuit SWCTL corresponding to the row block RBLK3 activates the high level setting signal VPP3X to a low level in synchronization with the setting signal VPPSET3Z. The high level voltage HLVL3 is switched from the internal power source voltage VII to the boosted voltage VPP (FIG. 17 (u)). The detection signals DET3Z and DETZ are output, and the enable signal VPENZ is activated in synchronization with the detection signal DETZ (FIGS. 17 (v) and (w)). The pumping circuit PUMP1 operates and generates the boosted voltage VPP while the enable signal VPENZ is at a high level (FIG. 17 (x)).

The third embodiment achieves substantially the same kind of advantage as the previous embodiments. With the pseudo-SRAM too, in substantially the same way as with the SDRAM, the consumption current may be reduced.

The VPP generation circuit 24 of the semiconductor memory MEM illustrated in FIG. 15 may be replaced with the VPP generation circuit 24A illustrated in FIG. 13.

The previous embodiments are applied to an SDRAM and a pseudo-SRAM. The previous embodiments may be applied to another semiconductor memory MEM where a higher-than-normal voltage is applied to a transistor. The previous embodiments may be applied to another semiconductor device where a higher-than-normal-voltage is applied to a transistor. The semiconductor device may include a standby mode and an active mode, and may include a pumping circuit which generates a boosted voltage to be supplied to a high level voltage line. The semiconductor device may include a switch for coupling one of two kinds of boosted voltage to the high level voltage line. The semiconductor device may increase the drive capability of a pumping circuit when switching the boosted voltage of a high level voltage line coupled to the gate or source of the transistor to a high potential side, in order to change the voltage of a control signal line coupled to the drain of the transistor.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. A semiconductor memory, comprising:
   a voltage supply circuit configured to supply a first voltage to a word line when an internal circuit is in a standby state, and configured to supply a second voltage higher than the first voltage to the word line when the internal circuit is in an active state;
   a detection circuit configured to detect a change of a voltage to be supplied; and
   a control circuit configured to change a drive capacity of the voltage supply circuit upon detecting a change from the first voltage to the second voltage and maintain the drive capacity upon detecting that there is no voltage change when the internal circuit switches from the standby state to the active state.

2. The semiconductor memory according to claim 1, wherein the voltage supply circuit includes at least a first pumping circuit and a second pumping circuit, wherein the first pumping circuit and second pumping circuit are configured to operate contemporaneously by the control circuit.

3. The semiconductor memory according to claim 2, wherein the second pumping circuit is configured not to operate when the internal circuit is in one of the standby state and the active state.

4. The semiconductor memory according to claim 1, wherein the voltage supply circuit includes an oscillator, and wherein a cycle of the oscillator is changed by the control circuit.

5. The semiconductor memory according to claim 1, wherein the internal circuit includes a plurality of block circuits, wherein the control circuit instructs a change when at least one of the plurality of block circuits is selected.

6. The semiconductor memory according to claim 1, wherein the internal circuit includes the detection circuit configured to supply a detection signal to the control circuit.

7. A semiconductor device, comprising:
   a drive capability of a voltage generation circuit configured to generate a voltage to be supplied to a word line is set to a first level when an internal circuit is in a standby state or in an active state; and
   a detection circuit configured to detect a change of the voltage from a first voltage to a second voltage, the second voltage being higher than the first voltage,
   wherein the drive capability of the voltage generation circuit configured to be set to a second level at which the drive capability is higher than that at the first level upon detecting a change from the first voltage to the second voltage and maintain the drive capacity upon detecting that there is no voltage change when the internal circuit switches from the standby state to the active state.

8. The semiconductor device according to claim 7, wherein the voltage generation circuit includes a plurality of pumping circuits, at least one of the plurality of pumping circuits sets the first level, and the plurality of pumping circuits set the second level.

9. The semiconductor device according to claim 8, wherein the voltage supply circuit includes an oscillator, and wherein the first level and second level are set by changing a cycle of the oscillator in accordance with a control signal.

10. The semiconductor device according to claim 7, wherein the internal circuit includes a plurality of block circuits, and wherein the second level is set when at least one of the plurality of block circuits is selected.

11. The semiconductor device according to claim 7, wherein the second level is set when it is detected that the voltage supplied to the word line is switched from a first voltage to a second voltage higher than the first voltage.

12. A system, comprising:
    a memory controller; and
    a semiconductor memory controlled by the memory controller,
    wherein the semiconductor memory includes:
    a voltage supply circuit configured to supply a first voltage to a word line when an internal circuit is in a standby state and configured to supply a second voltage higher than the first voltage to the word line when the internal circuit is in an active state;
    a detection circuit configured to detect a change of a voltage to be supplied to the word line; and
    a control circuit configured to change a drive capacity of the voltage supply circuit upon detecting a change from the first voltage to the second voltage and maintain the drive capacity upon detecting that there is no voltage change when the internal circuit switches from the standby state to the active state.

13. The system according to claim 12, wherein the voltage supply circuit includes at least a first pumping circuit and a second pumping circuit, and wherein the first pumping circuit and second pumping circuit are configured to be operated contemporaneously by the control circuit.

14. The system according to claim 12, wherein the voltage supply circuit includes an oscillator, and wherein a cycle of the oscillator is changed by the control circuit.

15. The system according to claim 12, wherein the memory controller is configured to supply at least one of a standby state command and an active state command to the semiconductor memory.

16. The system according to claim 12, wherein the semiconductor memory is configured to supply a detection signal to the control circuit upon detecting that the voltage supplied to the word line is switched from the first voltage to the second voltage.

17. The semiconductor memory according to claim 1, wherein the control circuit stops changing the drive capacity based on an active signal indicating a cycle period for an operation.

18. The system according to claim 12, wherein the control circuit stops changing the drive capacity based on an active signal indicating a cycle period for an operation.

* * * * *